(12) United States Patent
Beeman

(10) Patent No.: US 7,439,747 B2
(45) Date of Patent: Oct. 21, 2008

(54) LOCATION OF HIGH RESISTANCE GROUND FAULTS ON BURIED POWER-CABLES

(76) Inventor: Terrence M. Beeman, 183 MacAulay Crescent, Winnipeg, Manitoba (CA) R2G 0P6

( * ) Notice: Subject to any disclaimer, the term of this patent is extended or adjusted under 35 U.S.C. 154(b) by 0 days.

(21) Appl. No.: 11/616,442

(22) Filed: Dec. 27, 2006

(65) Prior Publication Data

US 2008/0157780 A1    Jul. 3, 2008

(51) Int. Cl.
G01R 31/28    (2006.01)
(52) U.S. Cl. .................. 324/528; 324/529; 324/533; 343/713; 379/22
(58) Field of Classification Search ............ 324/528, 324/529
See application file for complete search history.

(56) References Cited

U.S. PATENT DOCUMENTS

| | | | | |
|---|---|---|---|---|
| 3,991,363 A * | 11/1976 | Lathrop | ...................... | 324/529 |
| RE29,525 E * | 1/1978 | Willmott | .................... | 375/239 |
| 4,992,800 A * | 2/1991 | Parfitt | ......................... | 343/713 |
| 5,369,366 A * | 11/1994 | Piesinger | .................... | 324/533 |
| 5,428,295 A * | 6/1995 | Beeman | ....................... | 324/529 |
| 5,570,028 A * | 10/1996 | Sperlazzo et al. | ........... | 324/528 |
| 5,790,391 A * | 8/1998 | Stich et al. | ..................... | 363/24 |
| 5,917,298 A * | 6/1999 | Miller | ........................ | 318/444 |
| 5,995,588 A * | 11/1999 | Crick | .......................... | 379/22 |
| 6,181,140 B1 * | 1/2001 | Vokey et al. | ................. | 324/523 |
| 6,867,596 B1 * | 3/2005 | Mizuno | ....................... | 324/528 |
| 2004/0227517 A1 * | 11/2004 | Mizuno | ....................... | 324/326 |

\* cited by examiner

*Primary Examiner*—Diego Gutierrez
*Assistant Examiner*—Benjamin M Baldridge
(74) *Attorney, Agent, or Firm*—Adrian D. Battison; Ade & Company Inc.

(57) ABSTRACT

The location of high resistance ground faults within buried co-axial power cables can be detected by transmitting a combined signal along the cable at a primary frequency of 0.718 Hz and a primary amplitude in the order of 4,500 volts peak to peak. This combined signal also has an interlocked secondary frequency of 11,780 Hz superimposed on the primary frequency. The ratio between the reactive impedance and resistive impedance is such as to create a condition where the 0.718 Hz primary frequency's single source caused resistive current is usually larger than the sum or total of all that cable's per foot of length's 0.718 Hz reactive currents. This condition then enables the detection of the resistive ground faults by a manually transported Receiver. When needed the effective resistance and/or capacitance of the cable can be increased by a remote end connection circuit.

15 Claims, 4 Drawing Sheets

LOCATION OF HIGH RESISTANCE GROUND FAULTS ON BURIED POWER-CABLES

This invention relates to a method for locating high resistance ground faults on buried co-axial type power cables. The method is carried out by applying an oscillating waveform across the inner central and outer sheath conductors to generate in any high resistance type ground fault a fault current from the central conductor to the ground return conductor through the fault which is large enough to generate a detectable change in the magnetic field around the area of a fault and by tracing the length of the cable with a receiver arranged to detect the electromagnetic field emitted by the cable in response to the fault current signal.

BACKGROUND OF THE INVENTION

The very high DC voltage based thumper method presently being used by most electrical power companies is unfortunately destructive to the original predicted life of any buried concentric ground type cable that it has been used on, as well as being potentially dangerous for people.

In my prior U.S. Pat. No. 5,428,295 issued June 1995 is disclosed a method of this general type but this has not achieved significant commercial success due to the problems principally with the dual opposing coil type receiver's antenna really operates not as well as what is discussed below.

Using the above method, whenever one tries to locate any High-Resistance Ground Faults within a buried concentric ground type cable using one of the current-crop of conventional Fault Locaters, one will almost always end up being defeated by that cable's excessively high capacitive reactive current. This is because at the tracing frequencies being used by most, if not all, of these current Fault-Locaters the concentric ground type cable's capacitive reactive current is always going to be totally overriding or masking the detection of almost every or any HRG Fault's resistive current. This in turn is because most, if not all, of those HRG Fault's resistive currents are almost always much smaller in scale than the reactive current being created by as little as a one foot of any buried concentric-ground type cable's capacity. Even when this is not the case, it is almost always going to be smaller than the reactive current being created by just a few feet of every concentric ground type cable's capacity.

Even when a 60 Hz 120 V rms is used as a trace-signal, only 34 feet of most buried concentric-ground type cables will create more reactive current than a single 1.0 Meg-ohm HRG Fault creates as its resistive current. Any of the usually used higher trace signal frequencies and any of the lower trace signal voltages that are usually used by most of today's Fault Locaters make them even worse off. By looking at the results that occur when using even a relatively low 510 Hz as the trace signal, (where it only requires less than 4.0 feet of most concentric ground type cables to duplicate in a reactive current the resistive current being created by a single 1.0 Meg-ohm HRG Fault), one can better understand the effects that most of the even higher more commonly used trace frequencies are going to cause.

SUMMARY OF THE INVENTION

It is one object of the present invention to provide a method of locating high resistance ground faults on buried co-axial type power-cables of the above type which may overcome one or more of the above problems.

According to a first aspect of the invention there is provided a method of detecting high resistance ground faults of a resistance of greater than 250 K-ohms in an underground electric power cable including a central conductor with a dielectric material surrounding the central conductor and a ground return sheath conductor surrounding the dielectric material the method comprising:

transmitting into a length of the cable a signal which is connected across the central conductor and the ground return conductor;

the signal comprising an oscillating wave form at a predetermined frequency and of a predetermined peak to peak voltage;

tracing the length of this cable with a receiver arranged to detect an electromagnetic field emitted by the cable in response to the signal;

selecting the peak to peak voltage and the predetermined frequency to produce in the high resistance ground faults a fault-current from the central conductor to the ground return conductor through the fault which is large enough to generate a detectable change in the magnetic field around the area of a fault;

wherein the oscillating waveform has a frequency less than 2.0 Hz.

Preferably the frequency is between 0.200 Hz to 2.0 Hz and more preferably of the order of 0.718 Hz.

Preferably the voltage is between 355 V-rms to 3,550 V-rms and more preferably of the order of 4,500 V-pp.

In accordance with an important feature of the invention, the signal includes a second frequency component superimposed on the oscillating wave form at a much higher frequency to form a dual frequency signal format where the second frequency component is selected such that it has the following characteristics relative to the oscillating waveform: a 11,780 Hz signal that starts out as a 32 Vpp square wave when working into a non resonant 1,000 ohm resistive termination. The second frequency component is selected such that it has the following characteristics relative to the oscillating waveform an ability to be converted into an audible signal in the receiver which provide it with a better operator's confident use of the 0.718 Hz high-resistance ground-fault type of detecting ability. The second frequency component is selected such that it has the following characteristics relative to the oscillating waveform a 11,780 Hz signal which has been superimposed on to the top of the oscillating waveform with a transformer whose secondary winding output is always in series resonance at 11,780 Hz with the any cable being surveyed which provide it with superior security through employing an unmistakable marking and/or identification frequency detected by the receiver.

The 0.2 Hz to 2.0 Hz range of Ultra Low or Sub Audio Frequencies had originally been so selected on the premise that this range of frequencies are such that with most Concentric Ground Cable's the lumped or accumulated length of cable capacities come in at about 0.05 uFD for 625 feet of CG Cable 0, 10 uFD for 1,250 feet of CG Cable, 0.15 uFD for 1,875 feet of CG Cable, and 0.20 uFD for 2,500 feet of CG Cable, and that this yields the following capacitive reactances at the following frequencies:

625 feet of CG Cable at 1,440 Hz the Xc=~2,210,485 ohms
1,250 feet of CG Cable at 0.720 Hz the Xc=~2,210,485 ohms
1,875 feet of CG Cable at 0.480 Hz the Xc=~2,210,485 ohms
2,500 feet of CG Cable at 0.360 Hz the Xc=~2,210,485 ohms And in that the highest values of High Resistance Ground Faults within or on most CG Cable averaged out at around 2.2 Meg-ohms, meant that for the above cable lengths, at the above frequencies, it took a certain length of CG Cable at a certain frequency before the Xc of that particular CG Cable's lumped or accumulated capacity equaled the resistance of the largest HRG Faults whose locations were going to be searched out.

So on this basis the 0.718 Hz was so selected because it took about 2,500 feet of the typical CG Cable before the Xc of that CG Cable was equal to, or slightly larger than, the typical average 1.0 Meg-ohm value of resistive ground fault whose location was going to be searched out. Also for even those resistive ground faults which are as high as 2.2 Meg-ohms, on average they are always going to be more than 1,250 feet away from one or the other of the two CG Cable ends from which the searches for their location can or will be conducted from.

Also beyond those above listed sets of considerations, the 0.718 Hz was also selected because when I was proto-boarding the receiver the obtaining of High-Qs for any active filters that were operating below about 0.7 Hz involved using two precision capacity values that were getting more and more difficult to achieve with any consistently.

Then once the 0.718 Hz Ultra Low primary searching frequency had been so selected, (which then set the value of the 5,000V dc high voltage capacitor used to bypass the 50 K-ohm 50 watt inrush current limiting resistor to 0.005 uFD), (this being because of the length of about 4.0 degrees in the dead-band that could be tolerated in between the 0.0 to 180 degree 0.718 Hz half cycle and the 180 to 360 degree 0.718 Hz half cycle), was in part what set the frequency the higher secondary frequency that was going to be super-imposed on that 0.718 Hz primary frequency. In order to assure that this secondary frequency was always going to be present in substantial current amounts for most of the expected CG Cable lengths that were expected to be being search out, it had to be high enough in frequency that a good series resonant circuit could always be set up using only one coupling transformer's secondary's inductance. So for the majority of CG Cable lengths expected running somewhere between a low of about 300 feet to high of about 2,500 feet was the main reason that a secondary frequency in the range of 10,000.00 Hz was going to be selected.

Also because the primary frequency is in the area of 0.718 Hz, and the 184 Hz and 368 Hz harmonic-tones of same are about the 0.718 Hz*256 and 0.718 Hz*512. Then the continuous binary division of 11,780 Hz eventually yields those two frequencies. Thus, 11,780 Hz was so selected as the best harmonically related interlocked secondary frequency for the 0.718 Hz primary frequency using all the above mentioned considerations.

Preferably the oscillating waveform is square wave signal as opposed to a sinusoidal type signal.

Preferably the transmitter is connected to into a high-Q series resonant circuit to create the greatest currents possible at the higher secondary frequency to provide the unmistakable identify to its non resonating circuit's 0.718 Hz primary frequency.

Preferably the receiver uses a four analog switch circuit and a binary-divider to provide it with confirmation that signal is genuine by converting the magnitude of each of the received current-level's magnetic signals generated by the low frequency oscillating waveform into two different and distinctive per half cycle audible tones by using a continuous cycle magnetic signals received in the same time frame from the higher secondary frequency current.

Preferably the oscillating waveform is created by a transformer providing two direct current supplies at opposite polarity and providing a switching system for connection of the supplies to an output.

Preferably the switching system is mechanical.

Preferably the switching system includes a rotary disk with brushes and conductive traces.

Preferably the conductive traces include non-connect spaces

Preferably there is provided a remote end connection circuit which is connected across the central conductor and the ground return conductor for changing and/or adding additional reactance at the remote end.

Preferably the remote end connection circuit is used for finding even higher resistance ground faults by connecting a resistance across the conductors at the remote end to raise the total amount of resistive current that is flowing.

Preferably the remote end connection circuit is used for being able to search out the entire length of most faulted cables by adding more capacitance to add a virtual portion of an additional length to the cable.

According to a second aspect of the invention there is provided a method of detecting high resistance ground faults of a resistance of greater than 250 K-ohms in an underground electric power cable including a central conductor with a dielectric material surrounding the central conductor and a ground return conductor surrounding the dielectric material, the method comprising:

transmitting into a length of the cable a signal which is connected across the central conductor and the ground return conductor;

the signal comprising an oscillating wave form at a predetermined frequency and of a predetermined peak to peak voltage;

tracing the length of this cable with a receiver arranged to detect an electromagnetic field emitted by the cable in response to the signal;

selecting the peak to peak voltage and the predetermined frequency to produce in the high resistance ground faults a fault current from the central conductor to the ground return conductor through the fault which is large enough to generate a detectable change in the magnetic field around the area of a fault;

wherein the signal includes a second frequency component superimposed on the oscillating wave form at a higher frequency to form a dual-frequency signal format.

According to a third aspect of the invention there is provided a method of detecting high resistance ground faults of a resistance of greater than 250 K-ohms in an underground electric power cable including a central conductor with a dielectric material surrounding the central conductor and a ground return conductor surrounding the dielectric material, the method comprising:

transmitting into a length of the cable a signal which is connected across the central conductor and the ground return conductor;

the signal comprising an oscillating wave form at a predetermined frequency and of a predetermined peak to peak voltage;

tracing the length of this cable with a receiver arranged to detect an electromagnetic field emitted by the cable in response to the signal;

selecting the peak to peak voltage and the predetermined frequency to produce in the high resistance ground faults a fault current from the central conductor to the ground return conductor through the fault which is large enough to generate a detectable change in the magnetic field around the area of a fault;

wherein the oscillating waveform is created by a transformer providing two direct current supplies at opposite polarity and providing a switching system for connection of the supplies to an output.

According to a fourth aspect of the invention there is provided a is method of detecting high resistance ground faults of a resistance of greater than 250 K-ohms in an underground electric power cable including a central conductor with a dielectric material surrounding the central conductor and a ground return conductor surrounding the dielectric material, the method comprising:

transmitting into a length of the cable a signal which is connected across the central conductor and the ground return conductor;

the signal comprising an oscillating wave form at a predetermined frequency and of a predetermined peak to peak voltage;

tracing the length of this cable with a receiver arranged to detect an electromagnetic field emitted by the cable in response to the signal;

selecting the peak to peak voltage and the predetermined frequency to produce in the high resistance ground faults a fault current from the central conductor to the ground return conductor through the fault which is large enough to generate a detectable change in the magnetic field around the area of a fault;

wherein there is provided a remote end connection circuit which is connected across the central conductor and the ground return conductor for changing a reactance at the remote end.

This new kind of ULF Fault Locater has the potential for being a far less destructive method of, or for trying to locate most High Resistance Ground Faults within any buried concentric ground type cable than the methods presently being used. Plus it also has the potential at least for being far less dangerous to use when being operated by knowledgeable people. The use of an Ultra Low Frequency Fault Locater can create some of the following advantages:

Firstly where the ULF Transmitter's output-signal is a uniquely combined one, it almost always makes any resulting HRG Fault's resistive current either the majority of all the ultra low frequency trace signal current flowing, or at least a very substantial minority portion of all the ultra low frequency tracing signal current flowing, even when the under survey buried cable's span might exceed 2,500 feet in length.

Secondly where the ULF Receiver being exclusively dedicated to its ULF Transmitter's uniquely combined output signal, it will only be producing an exact and interference-free reading of what that ULF Transmitters ultra low frequency's output signal's current-level is at the spot on the cable which that ULF Receiver's antenna is at that time momentarily directly above. Any or all of this can only happen when the signal's current is coming from a ULF Receiver's matching ULF Transmitter.

BRIEF DESCRIPTION OF THE DRAWINGS

One embodiment of the invention will now be described in conjunction with the accompanying drawings in which.

In the drawings like characters of reference indicate corresponding parts in the different figures.

DETAILED DESCRIPTION OVERVIEW

Figure 1:
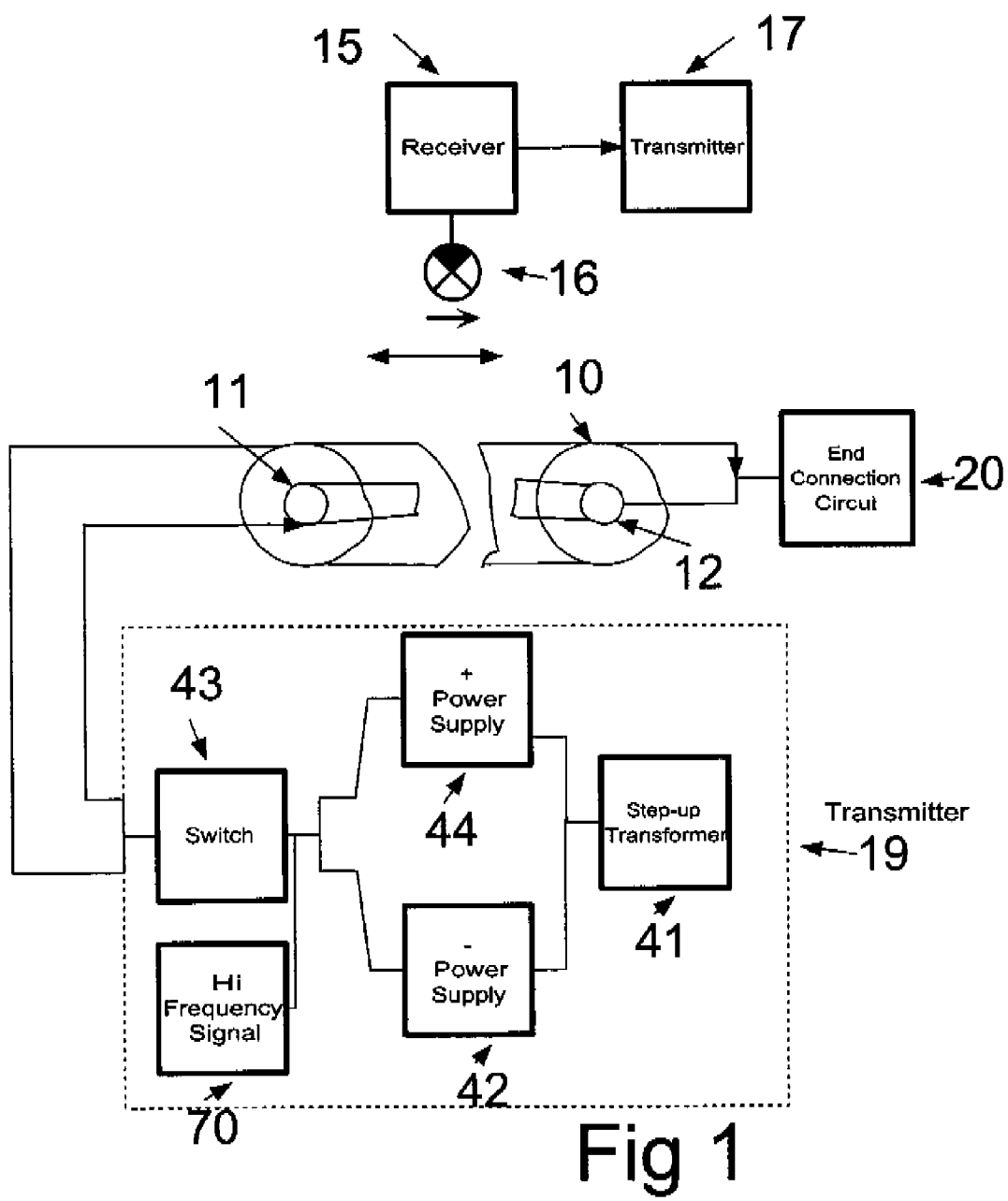
FIG. 1 is a schematic illustration of the components of an apparatus for carrying out the method according to the present invention.

In FIG. 1 is shown an overview of the system disclosed in detail herein where there is provided a buried co-axial power cable 10 with a lead end 11 and an opposed end 12. A transmitter section 19 is arranged at the lead end for transmitting a signal into the cable as described in full detail hereinafter. An end connection circuit 20 is located at the opposed end for receiving the signal and applying a required connection across the hot and return conductors of the cable. A receiver 15 can be transported along the cable on a suitable support 16 and provides an output audio signal to the operator as indicated at 17.

As described in detail hereinafter the signal generated by the transmitter includes an ultra low frequency carrier signal selected in the range 0.200 Hz to 2.0 Hz and a high frequency marker signal.

Because this ULF System's Transmitter's lowest frequency component is always going to be running between 0.200 Hz to 2.0 Hz, and is going to be using an output voltage that is somewhere between 355 V-rms, (1,000 V-pp), to 3,550 V-rms, (10,000 V-pp), it will usually make the resistive fault currents that have resulted from any HRG Fault whose value is around 1.0 to 2.0 Meg-ohms the majority of the all the ultra low frequency current flowing. However, depending on which of the ultra low frequencies is being used from within the above mentioned range, this majority current case will only be the valid when the lengths of the faulted cable involved do not exceed either 9,000 feet or 900 feet in length respectively. This characteristic is of course taken into account in the selection of specific frequency to be used.

So when one applies Maxwell's Electrical Current and Magnetic Field theories to the case of using the ULF Receiver for trying to find the location of a HRG Fault by tracing the ultra low frequency signal current that has mainly resulted from that same HRG Fault: The most likely explanation for the point where the reception of the ULF Transmitter's signal current has seriously dropped-off is the one where you may have just located the position of that HRG Fault, or when that has proved not to be the case, that you are at, or very nearly at, the other or opposite end of that cable's actual length.

The Transmitter

The transmitter is made from one of two opposite polarity High Voltage DC Supplies that are alternately being connected between its High or Hot Output Terminal and its Common or Ground Return Terminal at a constant Low Frequency rate. In the Transmitter, an electro mechanical method is used to accomplish all of the exact symmetry and precisely timing needed or used for the output signal.

The second higher frequency is constantly being inserted into, or onto, the low primary frequency. This second superimposed signal is preferably somewhere between 500 to 50,000 times higher in frequency than the primary frequency. This unique combination of two interdependent or interlocked frequencies provides the Transmitter with its dependable, unmistakable, and secure type of tracing signal. The trustworthy and secure nature of this type of a ULF tracing-signal is effective because it is very unlikely that this type of signal will ever have been created by any other kind of natural or concocted source or methodology.

This two opposite polarity, but otherwise identical, High Voltage DC Supplies both operate preferably between 500 V-dc to 5,000 V-dc, and are constructed using one of several different possible methods. Two of those possible methods are as follows:

Firstly, a 50 to 60 Hz 120 V-rms power-line-operated step-up type of transformer plus one or two half wave DC-supply cards.

Secondly one or two step-up type of DC to DC Flyback converters running off a 12 V-dc or 24 V-dc type of automotive, boat, or light aircraft type battery.

But irrespective of how the slowly alternating and high voltage portions of this combined output signal might have been created, it is the fact that this type of a combined output signal has within it both the precise timing and the exactly symmetrical characteristics that permits most of the resistive tracing currents that have been caused by HRG Faults to be both traceable, and then have most of their exact spots or locations identifiable, that are most important.

Figure 2:
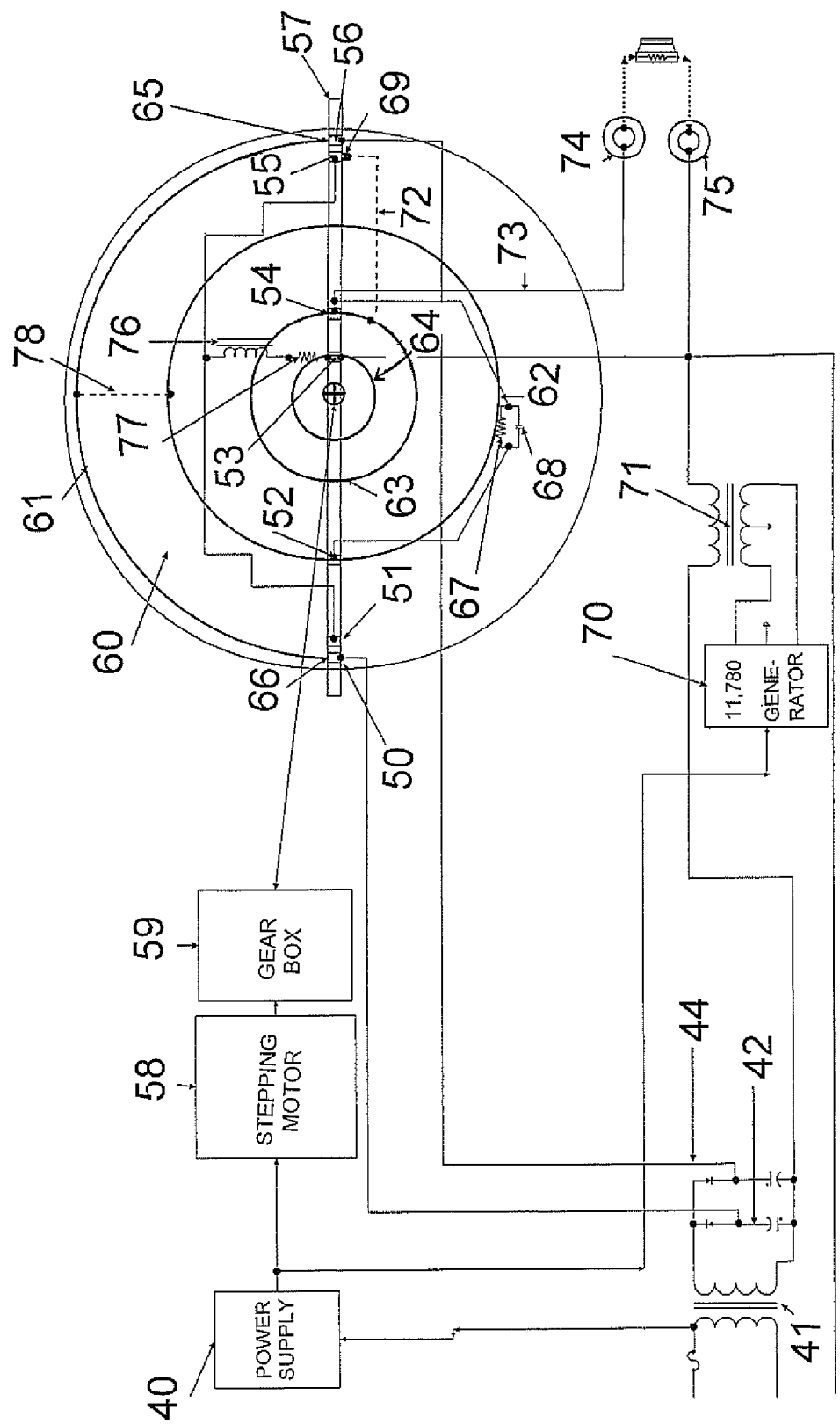
FIG. 2 is a schematic illustration of the signal generating components and transmitter of the apparatus of FIG. 1.

The Supply-source and its resulting 4,500 V-pp signal Section is the first so labelled block 40 within the ULF Section of this Transmitter's whole block or logic-diagram of FIG. 2. This uses a 50 to 60 Hz 110 V-rms 1 to 16 power line operated step-up transformer 41 along with two opposite polarity High Voltage half wave DC Supply cards in FIGS. 2, 42 and 44 to provide the two approximately positive and negative 2,250 DC Voltages that are used for creating the 4,500 V-pp ULF portion of the Transmitter's two combined frequency's output signal.

Both of these two High Voltage half wave DC Supply cards 42 and 44 each have a storage capacity of approximately 8.0 uFD at 2,700 WVDC minimum. Also, each of these two different alternately switched DC Supply card's output currents is limited to a maximum initial output-current-surge of around 0.05 amps DC. This initial 0.05 amps DC of current limiting is done by using a single high voltage power resistor of 50 K-ohms at 50 watts, IE: 5 separate 10 K-ohm power-resistors at 10 watts each in series.

For or at the second higher-frequency component of this ULF Transmitter's two combined output frequencies this single 50 K-ohm 50 watt resistor is parallel bypassed by a 0.005 uFD 5,000 V-dc capacitor. At any one time this 0.005 uFD capacitor will always be in a nearly total or at least partial in series resonance state with the inductance within the secondary winding of this higher frequency's driver transformer and either one of the + or – DC supply card's approximate 8.0 uFD capacity plus whatever the capacity is of the cable that is connected to the Transmitter might be. This driver transformer's secondary winding's inductance also acts as about a 2.25 E-6 seconds maximum sort of leading edge surge suppressing inductance for all the initial in rush currents at the start-up of each half cycle of the Ultra Low primary frequency. Another 0.75 amps-rms or 1.05 amps peak which is an approximately 15 times greater type of 0.05 amps-rms or 0.07 amps peak of 50 or 60 Hz short circuit AC current limiting for the secondary winding of this 1 to 16 step-up transformer is provided by using a 12 Amp slow blow fuse within the primary winding circuit of this power supply.

The Ultra Low Frequency Switch 43 in FIGS. 2 and 1 is the second so labelled block within the ULF Section of this Transmitter's block or logic diagram. As briefly referred to earlier, and as illustrated within the Transmitter's block or logic-diagram, an electro mechanical method is used for the alternate connecting of the ULF Transmitter's two opposite polarity High Voltage half wave DC Supplies to its HIGH or HOT output terminal. The best fault finding frequency for this alternating connecting, (or per half cycle switching), of the two + or – DC supply cards has been found, (empirically), to be around 0.718 Hz from all the other possibilities within that initial range of 0.2 to 2.0 Hz This 0.718 Hz primary frequency is about midway between the 60/83 and the 60/84 divisions or sub-harmonics of 60 Hz, ((60 Hz)/(0.718 Hz)=83.565), and/or about midway between the 50/69 and the 50/70 divisions or sub-harmonics of 50 Hz, ((50 Hz)/(0.718 Hz)=69.637). Some of this 0.718 Hz output's initial 2.2E 6 seconds of short circuit current protection and/or the 12 inch brush to 12 inch 176 degree conductive track's voltage arc protection is provided via the two DC supply card's shared single 50 K-ohm current limiting 50 watt power resistor in combination with the second 11,780 Hz higher frequency's driver transformer's secondary winding's 37.44 mH of inductance, which will be referred to in more detail later. In that this initial overall protective inductive/resistive time constant equals about (3*TRL=L/R), then the overall length of the effect of this 37.44 mH/50 K-Ohm combination is at most about ((3*TRL=3*(37.44E-3/5E4)*3)=0.0000022 sec or 2.2E 6 sec). This external to the commutating-plate 50 K-ohm 50 watt power resistor and its associated also external 0.005 uFD 5,000 V-dc bypassing capacitor is electrically and/or physically located in between the over 12 inch commutating plate's 4,500 V-pp high voltage path's 8 inch diameter brush 52 and the Hot or High output terminal's 4 inch diameter brush 54.

These two brushes 52 and 54 are both parts of the whole seven different brushes 50 to 56 on the over 12 inch fixed common brush holder 57. In some way all of these seven different brushes allow the two DC Supply cards in series with the 50 K-ohm 50 watt power resistor to output the Ultra Low Frequency 4,500 V-pp part of the dual frequency combined signal. To implement this so chosen electro mechanical switching-rate of 0.718 Hz, the apparatus uses a stepping motor type IC driver chip schematically indicated at 58 in conjunction with a stable internal clock oscillator and a 24 step per revolution type of stepping motor plus a 15 to 1 reducing gear train 59.

The stepping motor's 24 step division of its IC driver chip's approximately 258.48 Hz output frequency results in it producing a mechanical rotating speed of 10.77 RPS or 646.2 RPM. This stepping motor's mechanical rotating speed of 10.77 RPS or 646.2 RPM is then through an associated 15 to 1 to reducing gearbox further reduced to that gearbox's output shaft's final mechanical rotation speed of 43.08 RPM or 0.718 RPS. This gear boxes output's mechanical rotation speed of 43.08 RPM or 0.718 RPS is what gives this Transmitter its Ultra Low or primary frequency of 0.718 Hz.

The Transmitter's block or logic diagram also shows that the gearbox's output shaft's rotation at 43.08 RPM, or 0.718 RPS is what drives this unit's single greater than 12 inch diameter flat disk or commutating plate 60 at its 0.718 RPS mechanical rotating speed or its electrical Ultra Low primary frequency of 0.718 Hz. It is the plate's 0.718 RPS or Hz rotation which is used by a single mechanically fixed over 12 inch long or diameter wide brush holder 57, that retains all seven of the various brushes 50 to 56 with all the needed various interconnections to the + or – DC supply cards and the two output terminals plus everything else that is used, which produces the approximately 4,500 V-pp quasi square wave 0.718 Hz primary frequency portion of the ULF Transmitter's dual frequency output. This is accomplished by always having the correct mechanical alignment and/or coordination between all the four different concentric conductive tracks 61 to 64 that are on this greater than 12 inch diameter rotating commutating plate's flat disk working in coordination with all the identically matching concentric diameter tracks used by all the seven different brushes that are on that single mechanically fixed greater than a 12 inch long or diameter wide brush holder.

At 0.718 Hz it takes approximately 1.392 seconds to complete each turn of 360 degrees on this flat disk or commutating plate. Also on the 12 inch diameter track each turn's 360 degrees uses a circumference of about 37.7 inches.

A comparable kind of operation could possibly be done by using several similarly sized sets of 12 inch diameter cams driving several different sets of High Voltage limit switches. However, regardless of the exact manner by which all the precisely timed and exactly symmetrical of this Transmitter's 0.718 Hz Ultra Low portion of the dual output frequency is created, via a commutating plate and brushes, or via sets of cams and limit switches, or even via several electronic solid state type switches, the highly accurate timing and the concise symmetry of this portion of the dual frequency output allows for the creation of a dedicated and workable ULF Receiver.

At 0.718 Hz, it requires that the greater than 12 inch diameter commutating plate's flat disk uses two identical none-connected times of about 4.0 degrees each to separate its two different 180 degree long half cycles. Either one of these two identical but different 4.0 degree disconnected gaps 65 and 66, both of which only end after the opening 2.0 degrees out of each of the two different 180 degree half cycles, and then restart after the completion of the next 176 degree part of each of the two different 180 degree half cycles, is used to separate and then isolate throughout the needed accumulated voltage discharge each of these two different 0.718 Hz 180 degree half cycles from the other one.

In more detail it is the middle 2.0 degrees of either one of those two different 4.0 degree disconnected gaps that is used to reduce whatever residual voltage charge has been left on that under survey cable's intrinsic capacity from what has now become its last just completed connection to either the + or − High voltage DC supply card from being as much as + or −2,250 Volts DC to nearly + or −0.0 Volts DC. Even though these two different 2.0 degree discharges are done repeatedly and continuously, all of it is done with its timing centered around either of the two different 0.0 degree or 180 degree electrical and mechanical zero crossover periods. Thus all of any cable's accumulated voltage charge's discharging only happens during either the 0.718 Hz cycle's 359 to 1.0 degree electrical and mechanical crossover period and/or the 179 to 181 degree electrical and mechanical crossover period.

When operating at this primary frequency of 0.718 Hz, while using a 12 inch diameter circular track that is on the Transmitter's commutating plate's flat disk, the two different 4.0 degree long none-connected times each involve an identical but separate break period of about 0.015475 seconds, (or 0.03095 seconds in total), out of the entire 1.3908 seconds required to complete each one of these 0.718 Hz cycle's and/or the flat disk's 360 degrees of mechanical rotation. Either one of these two identical 4.0 degree phase changes or none-connected times only occurs after the conclusion of an associated interconnection to one and/or the other of the two opposite polarity + or −2,250 V-dc DC supply cards and the cable under survey through the Transmitter's HIGH or HOT output terminal for each of their two different 176 degree portions that both symmetrically exist within each of their two different half cycles of 180 degrees. Both of these two different 176 degree long + and − connected times repeatedly get being done by using the same, or a common, continually rotating 18.431 inch long or 176 degree long segment which is the only conductive part on the commutating plate's 12 inch diameter 61 track's entire 360 degree long or 37.7 inch long circumference. Thus, this single 176 degree long conductive segment produces both of the two identical but opposite polarity + and −2,250 V-dc 176 degree long parts that make up all but the opening 2.0 degree and closing 2.0 degree isolating and then discharging parts of each of the two different 180 degree long half cycle phases that are within each 360 degree long 0.718 Hz cycle.

Either one of these two different 2.0 degree discharge periods that are used for dumping the cable's + or − accumulated electrical charge's only happens after the completion of the first degree, or opening 0.00387 seconds, of each of their two different associated and concurrent 4.0 degree none-contacted times has taken place or transpired. Then for the next 0.00774 seconds, or 2.0 degrees, the under survey cable's intrinsic capacitor's preceding half cycle's + or −2,250 V-dc energy charge is discharged through the Transmitter's single 10 K-ohm 40 watt high voltage discharging resistor, which is made up from 4 in series 2.5 K-ohm 10 watt power resistors. Via several different interconnections to the two 11 inch diameter brushes 51 and 55 and 2 inch diameter brush 53 on the over 12 inch long common fixed brush holder this external 10 K-ohm 40 watt power resistor is put in series with an external 300 mH iron core choke. The initial current limiting and voltage arc suppression traits of the inductance in this 300 mH/10 K-ohm combination's time constant are used to protect both the two 11 inch diameter brushes within the over 12 inch long fixed brush holder plus the 11 inch diameter track's single 2.0 degree conductive shorting pad on the over 12 inch diameter commutating plate whose 0.718 RPS mechanical rotation is creating all of these actions.

The maximum length of this 300 mH/10 K-ohm inductive/resistive combination's protective time constant is about TRL*3. So the time duration of each of this 300 mH/10 K-ohm combination's effects is at most about ((3*TRL) or (300E-3/1E4)*3) which is (0.000030 sec*3) which equals (0.000090 seconds or 9.0E 5 seconds). With each of these 300 mH/10 K-ohm combination's time constants only being about 0.000090 seconds long makes any or all of them about 1/86th the length of either of the two associated 0.00774 second long or 2.0 degree long discharging periods they repeatedly occur within. Finally each of these two individual but identical 0.00774 second long, or 2.0 degree long, discharging periods will then be followed by a second or another single degree long, or 0.00387 second long, totally disconnected period before that cable with its intrinsic capacity and its HRG Fault is reconnected to the next half cycle's + or −2,250 V DC supply card through the Transmitter's Hot or High output terminal using the same rotating flat disk's commutating plate's 12 inch diameter track's single common 176 degree long conductive segment. Thus, each mechanically constructed or fabricated cycle of the ULF Transmitter's 0.718 Hz primary ULF frequency has been made up from a single +2,250 V 176 degree long segment that was followed by 4.0 degree long none connected time and then a single 2,250 V 176 degree long segment which was followed by another 4.0 degree long none connected time.

Also, because those two 4.0 degree long none-connected times are identical, and they are both symmetrically occurring during one of the two electrical zero crossing incidents that only happen at the end of either one of the 0.718 Hz two half cycles, they have nearly NO or at least a MINIMAL effect on the overall symmetry and/or balance of this whole mechanically fabricated 0.718 Hz frequency's electrical authenticity. From another way of looking at it, this is because it is only during the middle 2.0 degrees of each and everyone of these two 4.0degree none-connected times, which are all or each about 0.015475 seconds long, that the under survey buried cable's associated intrinsic capacity's accumulated + or −2,250 Volts DC energy charge from the last just completed Transmitter's half cycle's connection could be, and therefore does, get discharged through that single and shared 10 K-ohm 40 Watt high voltage power resistor 77 and its associated in series 300 mH iron core choke 76 which provides some of the 11 inch brush's and 2.0 degree shorting pad's initial current limiting and wanted voltage arcing protection. This 10 K-ohm 40 watt resistor 77 is continuously reused to do all of this discharging by one of the two interconnected brushes that are housed within the fixed brush holder's 11 inch diameter discharge track.

This 11 inch diameter discharge track has two brushes 51 and 55 both of which work in conjunction with a single shared or common 2.0 degree long or 0.191 inch long continuously rotating shorting tab 69 which is the only conductive segment within the flat disk commutating plate's 11 inch diameter discharging track's whole 360 degrees or 34.56 inch long circumference. This 11 inch diameter discharge track's single 2.0 degree long conductive HV shorting tab in conjunction with the single over 12 inch long fixed brush holder's two 12 inch track's HV supply brushes are all so located as to be centered on, or located around, the 359 degree through the 1.0 degree portion and/or the 179 degree through the 181 degree portion of the 12 inch track's entire 360 degree long circumference. So the 11 inch diameter discharging track's two interconnected brushes 51 and 55 or one half of either of the two different 4.0 degree long gaps, ((4.0 degrees/2)+(4.0 degrees/2)=4.0 degrees), when added to the commutating plate's 12 inch track's conductive 176 degree part or subtracted from the 184 degree long non-conductive part of its entire 37.69 inch long circumference make up the two 0.0 degree and 180 degree crossover points that occur within each one of the 360 degree long 0.718 Hz primary frequency's cycles.

So even if one was using several similarly sized 12 inch diameter cams with several different high voltage limit-switches to mechanically generate this 4,500 V-pp 0.718 Hz quasi square wave, then this under survey cable's capacitors discharging would also still repeatedly get being done by using the same kind of single but shared 10 K-ohm 40 watt power-resistor in combination with a similar 300 mH iron core choke. However, in this multiple 12 inch cam and limit switch case the two different 2.0 degree discharging periods can be done using two interconnected limit switches that can both be riding on their own mutually shared 12 inch diameter cam which had only one critically located 2.0 degree Low or High spot on it that or which also corresponds to a second 12 inch cam's unique 176 degree segment's Low or High spot's associated 180 degree and/or 360 degree crossover-points.

Every under survey cable's capacity's stored electrical charge of + or −2,250 V-dc is discharged on a per half cycle basis because that reduces the size of the absolute voltage differences between that under survey cable's capacity and the next of the two different High Voltage DC Supply cards to which it is continuously being alternately connected to from something as large as 4,500 V-dc to something which at worst is nearer to 2,295 V-dc. The worst case for any of these 2,250 V-dc discharging-conditions where the last + or −45 V-dc still remains, only occur with the largest over 0.2 uFD capacities which are themselves only produced by under survey cable lengths above 2,500 feet.

With the primary frequency being set at 0.718 Hz, requires that the longest faulted cable's lengths that should be considered for survey be under, or at least no longer, than 2,500 feet in length. This then sets the cable's maximum capacity to be discharged at approximately 0.20 uFD, (80 pF per foot*2,500 feet=0.20 uFD). So when working with a maximum expected capacity of 0.20 uFD, and using a single common 10 K-ohm power resistor to do any or all of that discharging, translates into it at worst only having about 0.006 seconds or three RC Time constants, (3*0.2E−6 uFD*1E4 ohms=0.006 sec), to attempt to do all of this 0.2 uFD capacitor's discharging.

Whenever an under survey buried cable capacitor's last 0,718 Hz half cycle's accumulated charge, (either a + or −2,250 V-dc), is being discharged this always, and only, gets done during the middle 2.0 degrees of one or the other of the two equal but different 4.0 degree disconnected intervals, which are themselves in between each of the two different 176 degree oppositely phased + or −2,250 V-dc connected times. This accumulated charge's discharging is done by directly connecting the Transmitter's low or ground return terminal to the hot or high terminal through a single common 10 K-ohm 40 Watt power resistor in series with an initial voltage arc suppressing and discharging current limiting iron core 300 mH choke that may be similar to, and/or is, a Hammond 143R.

At a frequency of 0.718 Hz, while operating on circular track with a 11 inch diameter that has about a 34.56 inch circumference), a 2.0 degree segment on that 11 inch diameter track's rotation takes about 0.00774 seconds to transpire, ((2.0 degree)/(360 degree)*(0.718 Hz)=0.0077375 sec. The two identical maximum discharge times that are each about 0.00774 seconds in length sets the length of the 11 inch diameter track's single conductive pad 69 at 0.192 inches long out of the whole 11 inch diameter track's 34.56 inch long circumference. This single 0.192 inch conductive pad then translates into having the other 34.368 inches of this 11 inch diameter track's whole 34.56 inch circumference being completely blank or totally non-conductive.

When operating at a frequency of 0.718 Hz on the flat disk commutating plate's 12 inch diameter track the two separate and opposite polarity half-cycle + and −176 degree connected times will each share the same identical period of approximately 0.6809 seconds. Each of these two conductive periods of 0.68 seconds are both going to be created by the same single, or common, conductive and continually rotating 18.431 inch long segment or pad 61 that exists within part of the flat disk commutating plate's 12 inch diameter track's whole circumference of 37.7 inches. The other continually rotating non-conductive part of this whole 360 degree long or 37.7 inch long circumference is a 184 degree long or 19.299 inch long segment that is going to be completely blank. Contained within a part of this 19.299 inch long or 184 degree long continually rotating non-conductive segment are the two different but repeating 4.0 degree none connected times, which are each only 0.315 inches long and are what generates the two when required 4.0 degree gaps between the + and −176 degree half cycle phases of this whole 360 degree long 0.718 Hz primary signal's pattern.

Because there are always the same kind of finite limits within any method that is, or could be used, even if a solid state switching method was being used as opposed to either of the two earlier mentioned electro mechanical ones to generate this 0.718 Hz primary frequency portion of the ULF Transmitter's dual-frequency output signal, there would still be the same need for two 4.0 degree none connected times and two symmetrically located 2.0 degree capacitive discharge times within each of them, to first act as an isolating buffer and then act as a discharging method between each of the two opposite polarity + or −2,250 V-dc 176 degree long half cycle connected times.

The 0.718 Hz primary frequency creates enough current changes around most kinds of the High Resistance Ground Faults that are found within most buried cables to make the majority of them detectable. This will be demonstrated by examining two different sets of the same basic calculations. The first set will assume the fault finding signal to be sinusoidal type 4,500 V-pp 0.718 Hz primary frequency one. And the second set will assume that the fault finding signal is the actual quasi square wave type of 4,500 V-pp 0.718 Hz primary frequency. Both will react to the same variety of HRG Fault's various resistive and reactive current values. This will be done using the same variety of different values for any of these resistive faults while they are located at fixed positions within various lengths of faulted cable and in addition to various HRG Fault values and various cable lengths, the position of particular resistive faults within particular fixed lengths of cable may also be varied.

Whenever there has been more than a 2 to 1 or, (−3.0 dB), change in a particular cable's resistive fault's resistive current versus that same cable's remaining reactive current just after that particular resistive fault's location has been passed over, in comparison to what it had been just before that particular resistive fault location had been reached, it is considered as of having been a change that was adequate for that particular HRG Fault's detection.

When working into the approximate 0.1 uFD capacity of a 1,250 foot long length of cable which has within it a 1.0 Meg-ohm HRG Fault, the 0.718 Hz portion of the Transmitter's dual-frequency combined-signal would at worst generate at least 2.03 mA-pp or 0.72 mA-rms of a sinusoidal-type 0.718 Hz capacitive reactive current, ((4,500 V-pp)/(2,216,642 ohms)=0.00203 Amps-pp), and expend at least 9.14 W-pp or 1.15 W-rms of a sinusoidal-type 0.718 Hz capacitive reactive power, ((4,500 V-pp)*(0,00203 Amps)=9.14 W-pp). On a per foot basis this would equate to about 0.000576 mA-rms of that traceable 0.718 Hz sinusoidal-type reactive current's initial 0.72 mA-rms total strength being returned to the originating Transmitter's low or ground terminal during each single foot of travel down that cable's whole 1,250 foot long length when starting out from the Transmitter and going towards the opposite far end. The Transmitter would also be generating about 4.5 mA-pp or 1.6 mA-rms of a sinusoidal-type 0.718 Hz resistive fault current, ((4,500 V-pp)/(1E6 ohms)=0.0045 Amp-pp), and expending about 20.25 W-pp or 2.545 W-rms of a sinusoidal-type 0.718 Hz resistive fault power, ((4,500 V-pp)* (0.0045 Amp-pp)=20.25 W-pp).

This equates to all of that 1.0 Meg-ohm resistive fault's 1.6 mA-rms of traceable signal current only being lost just after one has gone beyond whatever the location of that resistive fault had happened to be. Also when one is working with the 0.1 uFD capacity of a 1,250 foot long length of cable that has a 1.0 Meg-ohm HRG Fault within it, the worst case's conditions for trying to find that Resistive Fault will only occur when that particular HRG Fault is located within the first 100 feet of cable that are immediately adjacent to the Transmitter's location where or when the reactive current is at its maximum.

During the start-up of each 0.718 Hz quasi square wave signal's positive half cycle's or negative half cycle's 176 degree long or 0.68 second long + or −2,250 V-dc connected time every initial half cycle's cable's capacitive in rush of current, (or what is the actual reactive current), always starts at about 45 mA-dc and then rolls off to only whatever the actual 0.718 Hz resistive fault's resistive current level is after a maximum of only 0.03 seconds. This maximum of a 0.03 second long time constant at the start-up of every 0.718 Hz actual square wave signal's half cycle is because each 0.718 Hz half cycle's start up current's size and time duration has been so set or limited by the ULF Transmitter's High or Hot output side's single 50 K-ohm 0.718 Hz current limiting 50 Watt power resistor, which is bypassed at 11,780 Hz with a 0.005 uFD 5,000 V-dc capacitor, and any faulted cable's maximum expected length of no more than 2,500 feel and/or its resulting maximum capacitive value of 0.20 uFD, ((50 K-ohms*0.2 uFD*3.0)=0.03 seconds). This worst case time constant of 0.03 seconds only represents about 4.4% of each half cycle's 2,250 V-dc 176 degree 0.68 second long connected time.

So when working under the worst case conditions on a 1,250 feet of cable with a single 1.0 Meg-ohm HRG Fault within it, which are when that particular HRG Fault is located within the first 100 feet of cable that are immediately adjacent to the Transmitter's location, the ratio of the sinusoidal-type resistive current plus the sinusoidal-type reactive current that both exist just before this HRG Fault's location to the sinusoidal-type reactive current that only exists after this HRG Fault's location is approximately ((1.6 mA-rms+0.72 mA-rms)/(0.72 mA-rms)=3.22 to 1). This equates to a MORE THAN ADEQUATE Receiver's sinusoidal-type audible signal change of about 5.08 dB as one passes over the HRG Fault's location. Conversely with the actual 4,500 V-pp 0.718 Hz signal being a quasi square wave as opposed to all the above calculation's using an assumed sinusoidal one, whatever 1,250 foot cable's 0.1 uFD capacity's reactive current there actually was only existed for about three RC time constants or 0.015 seconds out of each 0.718 Hz half-cycle's total of 0.69637883 seconds. In that every quasi square wave 0.718 Hz reactive current always starts at 45 mA and then decays to nearly 0.0 mA in three RC Time constants, which in this case is 0.015 seconds, the average reactive current over each 0.718 Hz half cycle was approximately ((22.5 mA*0.015 sec)/ (0.6964 sec)=0.4847 mA). Also the same 0.718 Hz Quasi square wave sets a 1.0 Meg-ohm resistive fault's current at ((2.25E3 Volts)/(1E6 ohms)=2.25 mA). So the quasi square wave type signal change around this 1.0 Meg-ohm Fault's location when it is within the first 100 feet of the cable nearest the Transmitter's location is approximately ((2.25 mA+0.4847 mA)/(0.4847 mA)=5.64 to 1). This equates to an EVEN MORE THAN ADEQUATE 7.5 dB quasi square wave type audible change as one passes over this 1.0 Meg-ohm HRG Fault.

Then if one is working with the same 0.1 uFD capacity of a 1,250 foot long length of cable that has a single 2.2 Meg-ohm HRG Fault within it, while under the same worst case's conditions for trying to find that Resistive Fault, which are when that particular HRG Fault is located within the first 100 feet of cable that are immediately adjacent to the Transmitter's location, the ratio of the sinusoidal-type is resistive current plus the sinusoidal-type reactive current that both exist just before this HRG Fault's location to the sinusoidal-type reactive current that only exists after this HRG Fault's location is approximately ((0.723068 mA-rms+0.72 mA-rms)/(0.72 mA-rms)=2.0075 to 1). This equates to an ADEQUATE Receiver's sinusoidal-type audible signal change of 3.0195 dB as one passes over the HRG Fault's location. Conversely with the actual 4,500 V-pp 0.718 Hz signal being a quasi square wave as opposed to all the above calculation's using an assumed sinusoidal one, whatever 1,250 foot cable's 0.1 uFD capacity's reactive current there actually was only existed for about three RC time constants or 0.015 seconds out of each 0.718 Hz half cycle's total of 0.69637883 seconds. In that every quasi square wave 0.718 Hz reactive current always starts at 45 mA and then decays to nearly 0.0 mA in three RC Time constants, which in this case is 0.015 seconds, the average reactive current over each 0.718 Hz half cycle was approximately ((22.5 mA*0.015 sec)/ (0.6964 sec)=0.4847 mA). Also the same 0.718 Hz Quasi square wave sets a 2.2 Meg-ohm resistive fault's current at ((2.25E3 Volts)/(2.2E6 ohms)=1.022 mA). So the quasi square wave type signal change around this 2.2 Meg-ohm Fault's location when it is within the first 100 feet of the cable nearest the Transmitter's location is approximately ((1.022 mA+0.4847 mA)/(0.4847 mA)=3.108 to 1). This equates to a MORE THAN ADEQUATE 4.925 dB quasi square wave type audible change as one passes over this 2.2 Meg-ohm HRG Fault.

Next when one is working with the 0.2 uFD capacity of a 2,500 foot long length of cable that has a single 1.0 Meg-ohm HRG Fault within it, while under the same worst case's conditions for trying to find a Resistive Fault, which are when is that particular HRG Fault is located within the first 100 feet of cable that are immediately adjacent to the Transmitter's location, the ratio of the sinusoidal-type resistive current plus the sinusoidal-type reactive current that both exist just before this HRG Fault's location to the sinusoidal-type reactive current that only exists after this HRG Fault's location is approximately ((1.591 mA-rms+1.44 mA-rms)/(1.44 mA-rms)=2.108 to 1). This equates to an ADEQUATE Receivers sinusoidal-type audible signal change of 3.2318 dB as one passes over the HRG Fault's location. Conversely with the actual 4,500 V-pp 0.718 Hz signal being a quasi-square wave as opposed to all the above calculation's using an assumed sinusoidal one, whatever 2,500 foot cable's 0.2 uFD capacity's reactive current there actually was only existed for about three RC time constants or 0.030 seconds out of each 0.718 Hz half cycle's total of 0.69637883 seconds. In that every quasi square wave 0.718 Hz reactive current always starts at 45 mA and then decays to nearly 0.0 mA in three RC Time constants, which in this case is 0.030 seconds, the average reactive current over each 0.718 Hz half cycle was approximately ((22.5 mA*0.030 sec)/(0.6964 sec)=0.9694 mA). Also the same 0.718 Hz Quasi square wave sets a 1.0 Meg-ohm resistive faults current at ((2.25E3 Volts)/(1.0E6 ohms)=2.25 mA). So the quasi square wave type signal change around this 1.0 Meg-ohm Fault's location when it is within the first 100 feet of the cable nearest the Transmitter's location is approximately ((2.25 mA+0.9694 mA)/(0.9694 mA)=3.21 to 1). This equates to a MORE THAN ADEQUATE 5.213 dB quasi square wave type audible change as one passes over this 1.0 Meg ohm HRG Fault.

Finally if one is working with the same 0.2 uFD capacity of a 2,500 foot long length of cable that has a single 2.2 Meg-ohm HRG Fault within it, while under the same worst case's conditions for trying to find a Resistive Fault, which are when that particular HRG Fault is located within the first 100 feet of cable that are immediately adjacent to the Transmitter's location, the ratio of the sinusoidal-type resistive current plus the sinusoidal-type reactive current that both exist just before this HRG Fault's location to the sinusoidal-type reactive current that only exists after this HRG Fault's location is approximately ((0.7232 mA-rms+1.44 mA-rms)/(1.44 mA-rms)=1.5022 to 1). This equates to a TOTALLY-INADEQUATE Receiver's sinusoidal-type audible signal change of ONLY 1.767 dB as one passes over the HRG Fault's location. Conversely with the actual 4,500 V-pp 0.718 Hz signal being a quasi square wave as opposed to all the above calculation's using an assumed sinusoidal one, whatever 2,500 foot cable's 0.2 uFD capacity's reactive current there actually was only existed for about three RC time constants or 0.030 seconds out of each 0.718 Hz half cycle's total of 0.69637883 seconds. In that every quasi square wave 0.718 Hz reactive current always starts at 45 mA and then decays to nearly 0.0 mA in three RC Time constants, which in this case is 0.030 seconds, the average reactive current over each 0.718 Hz half cycle was approximately ((22.5 mA*0.030 sec)/(0.6964 sec)=0.9694 mA). Also the same 0.718 Hz Quasi square wave sets a 2.2 Meg-ohm resistive faults current at ((2.25E3 Volts)/(2.2E6 ohms)=1.0227 mA). So the quasi square wave type signal change around this 2.2 Meg-ohm Fault's location when it is within the first 100 feet of the cable nearest the Transmitter is approximately ((1.0227 mA+0.9694 mA)/(0.9694 mA)=2.055 to 1). This equates to an ADEQUATE 3.128 dB quasi square wave type audible change as one passes over this 2.2 Meg-ohm HRG Fault.

Note: The optimum case for detecting the location of any HRG Fault only occurs whenever that HRG Fault is as far away from the transmitter's location as is possible.

So under most of the conditions similar to what had existed above, if one moves the Transmitter to the other or opposite end of that 2,500 foot long cable, then that single 2.2 Meg-ohm HRG Fault will now be located somewhere between 2,400 to 2,500 feet away from the Transmitter's location, Under what is now almost the most optimum case, the ratio of the sinusoidal-type resistive current plus the sinusoidal-type reactive current that exists just before this HRG Fault's location to the sinusoidal-type reactive current that only exists after this HRG Fault's location is now approximately ((0.72306 mA-rms=26 to 1). This equates to a MUCH MORE THAN ADEQUATE Receiver's sinusoidal-type audible signal change of approximately 14.15 dB as one passes over the HRG Fault's location. Conversely with the actual 4,500 V-pp 0.718 Hz signal being a quasi square wave as opposed to all the above calculation's using an assumed sinusoidal one, whatever 2,500 foot cable's 0.2 uFD capacity's reactive current there actually was only existed for about three RC time constants or 0.030 seconds out of each 0.718 Hz half cycle's total of 0.69637883 seconds. In that every quasi square wave 0.718 Hz reactive current always starts at 45 mA and then decays to nearly 0.0 mA in three RC Time constants, which in this case is 0.030 seconds, the average reactive current in the last 100 feet of a 2,500 foot cable over each 0.718 Hz half cycle was approximately ((22.5 mA*0.030 sec*100 feet)/(0.69637883 sec*2,500 feet)=0.0388 mA). Also the same 0.718 Hz Quasi-square wave sets a 2.2 Meg-ohm resistive fault's current at ((2.25E3 Volts)/(2.2E6 ohms)=1.0227 mA). So the quasi square wave type signal change around this 2.2 Meg-ohm Fault's location when it is approximately 2,400 feet away from the Transmitter is now approximately ((1.0227 mA+0.0388 mA)/(0.0388 mA)=27.36 to 1). This equates to a MUCH MORE THAN ADEQUATE 14.37 dB quasi square wave type audible change as one passes over this 2.2 Meg-ohm HRG Fault.

A driver card 70 is used for generating an interlocked and correct signal confirming secondary superimposed frequency. The second frequency of 11,780 Hz which is about 16,384 times higher than the 0.718 Hz primary frequency is superimposed onto or into the 0.718 Hz primary carrier from within or on the low or return-side of the ULF Transmitter's two output terminals. This second frequency of about 11,780 Hz is somewhere around midway between the 196th and the 197th harmonics of 60 Hz, ((11,780 Hz)/(60 Hz)=196.334), and/or about midway between the 235th and the 236th harmonics of 50 Hz, ((11,780 Hz)/(50 Hz)=235.6). The low or return side's insertion of a 11,780 Hz square wave signal at approximately 32 V-pp, (when not running in or under a 11,780 Hz in-series resonant status), (IE: whenever it is not connected to a cable under survey), is accomplished by using the secondary winding of a 1 to 2 step-up type of coupling or driver transformer. The driver includes a transformer 71 having a secondary winding specifically wound to produce an inductance as near as it can be to 37.44 mH. The actual electrical location of this inserted 11,780 Hz modulation is effected within the Low or common-side of the Transmitter, in between the return side's output terminal and the common-ground or Low side of the two HV supply card's two ~8.0 uFD capacitors.

During every 360 degree long cycle of the 0.718 Hz primary frequency the center tapped primary winding of this 1 to 2 step-up type of coupling or driver transformer will continuously be inputting one or the other of its primary side's center tapped winding's two different driving transistors + or −8.0 V-dc half cycle's push or pull current's phases that when taken together will result in the secondary winding producing its 32 V-pp 11,780 Hz square wave waveform.

This coupling or driver transformer's primary side's two opposite polarity diode protected power transistors will via their two respective emitter base junctions continuously be being driven on or off using the same split phase but common 11,780 Hz square wave voltage source. Thus, regardless of whether it is the positive or negative half cycle of the 4,500 V-pp 0.718 Hz primary signal's output, one or the other of this coupling or driver transformer's primary winding's two opposite polarity NPN or PNP power transistors will alternately be inserting its + or −8.0 V-dc half cycle's push or pull portion of what appears to be on the secondary winding's side as a 11,780 Hz non-resonate 32 V-pp type square wave whenever the transmitter is NOT connected to a buried cable, or a much higher type of semi-resonated sinusoidal output voltage whenever the transmitter IS connected to a buried cable that is being surveyed for the location of a High Resistance Ground Fault. This 11,780 Hz driver transformer's secondary winding's non-resonant signal's status of 32 V-pp only occurs when the Transmitter is only operating into is about a 1,000 ohm resistive load, and/or is not connected to any cable.

Whenever the Transmitter has been connected to a cable that is anywhere between 350 to 2,500 feet in length, (IE: a capacity of somewhere between 0.0028 uFD to 0.20 uFD), and it is operating, its driver transformer's secondary winding's 11,780 Hz output voltage will always appear to be operating at a sinusoidal voltage that is much higher than its non-resonated status of a 32 V-pp square wave one, (IE: as much as 178 V-pp to 604 V-pp respectively). This is because it is operating in an in-series semi-resonant manner. And because what originally started as this 11,780 Hz driver transformer's secondary winding's stepped-up square wave signal is now continuously being superimposed onto or into both half cycles of the 4,500 V-pp 0.718 Hz primary signal as a 178 V-pp to 604 V-pp sinusoidal voltage the Transmitter's net output has now become a dual frequency or two part one.

The main reason for inserting this second 11,780 Hz frequency onto or into the Transmitter's fault finding 0.718 Hz primary frequency is to provide that primary frequency with a distinct, unmistakable and authenticating marker which then gives any of the Receiver's operators the ability to instantaneously recognize whether the 0.718 Hz primary signal is genuine or not. This is because within the matching ULF Receiver this superimposed 11,780 Hz portion of the Transmitter's dual frequency output signal is through the use of the Receiver's highly filtered or tuned 11,780 Hz Section which is driven to saturation, made to produce a square wave type clocking output which is then used to produce via some binary division and some analog switch's mixing any or all of the Receiver's authentic 0.718 Hz even and odd half cycle signals into corresponding 368 Hz even audible tones and 184 Hz odd audible tones.

When using the Transmitter's basic block diagram as a visual guide, any current that has come about because of the in series resonance of the 11,780 Hz driver transformer's secondary winding's much greater than a 32 V-pp square wave signal's status would in a clockwise direction first have its resonated current effects impressed upwards towards the Transmitter's under survey faulted cable's ultimate destination through one or the other of the two opposite polarity high voltage DC supply card's 42 and 44 two similar 2,700 V-dc 8.0 uFD electrolytic capacitors, which when taken by themselves each only exhibit an impedance of about 1.69 ohms at this 11,780 Hz, (Xc=(1/(2*3.14*11,780*8.0E-6)=1.688 ohms).

After leaving either one of these two DC supply card's 8.0 uFD capacitor's high voltage sides this 11,780 Hz resonated current first starts going back downward towards the low or opposite side of its originating driver transformer's 37.44 mH secondary winding through the 176 degree conductive segment 61 of the plate 60. Then because the commutating plate's 12 inch diameter's 176 degree conductive segment 61 is interconnected to the commutating plate's 8 inch diameter's 360 degree conductive continuous segment via a wire 78 on the disk 60, this 11,780 Hz series resonated current will go through the 0.005 uFD 5,000 V-dc in series resonating capacitor, (whose Xc=(1/(2*3.14*11,780*0.005E-6)=2.7 K-ohm), and then on to the commutating plate's 4 inch brush 54 as well as the 4 inch diameter's 360 degree continuously conductive segment 63 and then even though it is not necessary even the 11 inch diameter's 2.0 degree shorting pad. This 0.005 uFD resonating capacitor 68 is in parallel with the 50 K-ohm 50 watt 0.718 Hz current limiting power resistor 67 and therefore effectively being used to BYPASS it at this 11,780 Hz frequency, (50 K-ohm/2.7 K-ohm=18.51/1).

Next from the commutating plate's 4 inch diameter 360 degree track's associated brush 54 this resonating 11,780 Hz signal goes out to the cable under survey through the Transmitter's HOT or HIGH side's Output Terminal 74 through a wire 73. From there after passing the faulted cable's approximately 0.1 uFD of distributed capacity, (which is at some point along its length being parallel bypassed by that particular cable's HRG Fault, and whose value may be anywhere between 0.1 to 2.2 Meg-ohms), it re-enters the Transmitter through the LOW or RETURN side's Output Terminal 75. Once there this 11,780 Hz signal current has returned to the opposite side of its originating coupling or driver transformer's secondary winding whose 37.44 mH of inductance, $(X_L=(2*3.14*11,780*0.03744)=2.771$ K-ohm). Throughout this circular route the 11,780 Hz current has always been in a quasi in series resonance state with the approximate 0.00476 uFD of combined capacitance exhibited by the cable's 0.1 uFD capacity plus either one of the two high voltage DC supply card's 8.0 uFD capacity and the 0.005 uFD 5,000 V-dc resonating capacity bypassing the 50 K-ohm 0.718 Hz current limiting power resistor.

It is the continuous and repeated addition of this ULF Transmitter's 11,780 Hz secondary frequency that causes an ever diminishing 11,780 Hz in-series resonance reactive current to be flowing through each foot of any cable's total length on the top of, or on the back of, the 0.718 Hz primary frequency's 4,500 V-pp signal. Once again this 11,780 Hz in series resonance current's main function is to give the Receiver's operator the confidence that they can only have been receiving and therefore have been working with an authentic version of the Transmitter's 0.718 Hz primary signal. When given that confidence it results in the Receiver's operator having the needed sense of security that this unique type of signal is telling them what is going on in that part of the cable they are presently monitoring. Any or all of these authentic 0.718 Hz signal assurances can only occur because this kind of a 0.718 Hz and a 11,780 Hz unique dual frequency combination is highly unlikely to have ever have been created from any other source other than the genuine ULF Transmitter.

Within the Receiver this needed valid 0.718 Hz type of signal security gets carried out by using the output from the 11,780 Hz portion of the Transmitter's combined signal as the clock frequency for the Receiver's ULF Section's fifth stage's frequency divider. Thus, it is only because of the driven to saturation or square wave output from the Receiver's 11,780 Hz Section which has then been combined with some binary division from the Receiver's ULF Section's fifth stage's frequency divider and then some mixing from two of the same fifth stage's four analog switches, that this 11,780 Hz signal eventually ends up producing the 368 Hz and 184 Hz tone bursts that give the Receiver's speaker's any of their audible outputs and the Receiver's meter coil movement any of its signal strength readings. When using this method, whenever either the 0.718 Hz or the 11,780 Hz frequencies are not present within the Receiver's antenna's induced signal, then there will not be any audible sounds or signal strength readings being outputted from that Receiver. So, it is only when both of these two different and inter locked frequencies are present within the Receiver's antenna's induced input, that the Receiver's audible output will produce what the operator will learn to expect as the only correct response. From the two preceding sentences, and the preceding paragraph, it should be evident that the 11,780 Hz frequency's component must be present within every half cycle of the Transmitter's 0.718 Hz primary fault finding frequency before the whole ULF System stands a chance of functioning at all, let alone properly.

Whenever an under survey buried cable capacitor's last 0.718 Hz half cycle's accumulated charge, (either a + or −2,250 V-dc), is being discharged, or shorted out, this does NO damage to any of the Transmitter's 11,780 Hz signal's generating circuitry. This is in part because during either of the two different 4.0 degree disconnected times the in series circuit of that the 11,780 Hz driver or coupling transformer's secondary had been working into has now become open. This is also because during both of these two different 4.0 degree disconnected times both of the two different 2,250 V DC supply card's 176 degree connected phases have ended, or been terminated. Above and beyond this, during the beginning of both of these two 176 degree connected times the 11,780 Hz driver or coupling transformer's primary winding's two different 300 V-dc power transistors are each protected from any back generated or reverse reflected primary winding's surge voltage resulting from the reflection of a secondary winding's initial in rushing DC current surge of about 48 mA, by two individual in series reverse biased 1,000 volt protecting diodes and two in parallel 50 V zener diodes which are each in series with their own 100 ohm current limiting power resistor.

It will be noted that the 11,780 Hz secondary superimposed frequency has an in series resonance status and has no HRG Fault finding characteristics. At 11,780 Hz the best in series resonance conditions only occur when there is about the 0.2 uFD capacity of a 2,500 feet long cable in series with the 8.0 uFD of capacity from either one of the two high voltage DC supply cards 42 and 44 and the 0.005 uFD of resonating capacity 68 that is bypassing the 0.718 Hz 50 K-ohm 50 watt current limiting power resistor 67. This yields a combined capacity of approximately 0.004875 uFD, $(X_c=(1/(2*3.14*11,780*0.004875E-6))=2.771$ K-ohms), which is being exactly counter balanced by the 37.44 mH of inductance, $(X_L=(2*3.14*11,780*0.03744)=2.771$ K-ohms), produced by the coupling or driver transformer's secondary winding. Only under this almost perfect in series resonance condition where the combined capacitive reactance of those three in series capacitors is almost, or, exactly the same as the inductive reactance of the coupling or driving-transformer's 37.44 mH secondary winding, do these two opposed reactive impedances almost completely null or cancel each other out. Whenever this optimum resonant condition happens, it is principally the 50 K-ohm resistor bypassing the 0.005 uFD capacitor and the coupling transformer's two winding's resistance and then to a lesser degree the under survey cable's own center and outside wire's combined resistance and all of the three different capacitor's own internal in parallel leakage resistances that lower the Q of this nearly perfect in series resonant circuit by each introducing some their own resistive losses into this 11,780 Hz signal's otherwise nearly perfect in series resonant status.

Of all these various inductors and capacitors making up this whole in series resonant circuit the single most imperfect reactance running within this set of four reactive component's is the Transmitter's internal 0.005 uFD resonating capacitor, which is in parallel with a 50 K-ohm 50 watt resistor. At 11,780 Hz this 0.005 uFD resonating capacitor's 2,702 ohms of capacitive reactance is being loaded down by 50 K-ohms of parallel resistance. This lessens the Q of this reactive component to about 18.5, $((Q=R_p/X_c)=(50,000$ ohms/2,702 ohms) $=18.505)$. Thus, the Transmitter's internal 0.005 uFD resonating-capacitor's in parallel 50 K-ohm loading resistor's in series resistive equivalent resistance, (or r's), is approximately 147 ohms, $(r's=(X_c*X_c)/R)=(2,702*2,702)/(5E4)$ $=146.016$ ohms). So even under the most ideal, or best, in series resonance conditions where $X_L=X_c$ this, (r's of 147 ohms), sets the 11,780 Hz maximum Output Power Level into even the ideal 0.2 uFD 2,500 foot long cable lengths at about 6.97 Watts-pp or 2.47 Watts-rms, (32 V-pp*32 V-pp/147 ohms=6.97 W-pp or 2.47 W-rms).

Within everyone of the six different cases of this 11,780 Hz resonant Current's mathematical analysis that are now going to follow, they are each going to use the actual semi-sinusoidal signal conditions that will consistently prevail within any or all of them. The various Qs of the four different circuits being used for these six different calculations will run anywhere between a Low of 4.5 to a High of 18. Even though the original driver transformer's secondary winding's input energy will always start out as a 32 V-pp 11,780 Hz square wave one, it is the Q of 4.5 to 18 that will convert any or all of those square wave energies into their eventual semi-sinusoidal waveforms.

For a cable whose length is approaching 2,500 feet the combined in series capacity of the Transmitter's two capacitors and the cable's single 0.2 uFD capacitor figures out at a total in series combined capacity of about 0.00487 uFD, which at 11,780 Hz is then almost exactly counter balanced or cancelled out by the 37.44 mH of inductance within the coupling or driver transformer's secondary winding, leaving a remaining current limiting reactance that is under 0.3 ohms. Under those conditions the total amount of 11,780 Hz in resonance signal available for this cable could be as high as $((32$ V-pp/0.3 ohms$)=106.67$ Amps-pp or 37.83 Amps-rms), But because of the in series resistive equivalent resistance, produced by the 50 K-ohm resistor in parallel with the 0.005 uFD capacitor within the Transmitter the actual square wave current running or ringing within this in series resonant circuit is approximately only $((32$ V-pp/1147.7 ohms$)=218$ mA-pp or 77 mA-rms). This then causes the in series resonance 11,780 Hz Voltage across either the driver transformer's secondary winding's 37.44 mH of inductance or the 0.00487 uFD of combined capacity to appear to be as large as 604 V-pp or 214 V-rms, The total strength of this in series resonance circuit's ringing current is about ((604 V-pp/(2*3.1416*37.44 mH*11,780 Hz)=218 mA-pp or 77 mA-rms). The amount of the in resonance signal circuits total ringing current's strength that is consumed by or lost within each foot of this 2,500 foot long cable is approximately ((218 mA-pp/(2,500)=0.111 mA-pp or 0.0394 mA-rms).

For a cable which is 1,250 feet in length the combined in series capacity of the Transmitter's two capacitors and the cable's single 0.1 uFD capacitor figures out at a total in series combined capacity of about 0.00476 uFD, which at 11,780 Hz and operating with an inductance of 37.44 mH leaves an additional uncancelled and current limiting reactance of about 67 ohms. But because of the in series resistive equivalent resistance of 147.7 ohms, produced by the 50 K-ohm resistor in parallel with the 0.005 uFD capacitor within the Transmitter the actual limiting reactance is more like the (Square-root of ((67 ohms)*(67 ohms)+(147.7 ohms)*(147.7 ohms)))=(Square root of 26,332 ohms) or 162 ohms, The total amount of 11,780 Hz in quasi resonance signal available for this 1,250 foot long cable is about ((32 V-pp/162 ohms=198 mA-pp or 70 mA-rms). This then causes the in series resonance 11,780 Hz Voltage across either the driver transformer's secondary winding's 37.44 mH of inductance or the 0.00476 uFD of combined capacity to appear to be as large as about 547 V-pp or 194 V-rms. The total strength of this in series resonance circuit's ringing current is about ((547 V-pp/ (2*3.1416*37.44 mH*11,780 Hz)=198 mA-pp or 70 mA-rms). The amount of the in resonance signal circuit's total ringing current's strength that is consumed by or lost within each foot of this 1,250 foot long cable is approximately ((198 mA-pp/(1,250)=0.1584 mA-pp or 0.0562 mA-rms).

For a cable which is 625 feet in length the combined in series capacity of the Transmitter's two capacitors and the cable's single 0.05 uFD capacitor figure out at a total in series combined capacity of about 0.00454 uFD, which at 11,780 Hz and operating with an inductance of 37.44 mH leaves an additional uncancelled reactance of about 205 ohms. But because of the in series resistive equivalent resistance of 147.7 ohms, produced by the 50 K-ohm resistor in parallel with the 0.005 uFD capacitor within the Transmitter the actual limiting reactance is more like the (Square root of ((205 ohms)*(205 ohms)+(147.7 ohms)*(147.7 ohms)))=(Square root of 63,737 ohms) or 252 ohms. The total amount of 11,780 Hz in quasi resonance signal available for this 625 foot long cable is about ((32 V-pp/252 ohms)=127 mA-pp or 45 mA-rms). This then causes the in series resonance 11,780 Hz Voltage across either the driver transformer's secondary winding's 37.44 mH of inductance or the 0.00454 uFD of combined capacity to appear to be as large as about 352 V-pp or 125 V-rms. The total strength of this in series resonance circuit's ringing current is about ((352 V-pp/(2*3.1416*37.44 mH*11,780 Hz)=127 mA-pp or 45 mA-rms). The amount of the in resonance signal circuit's total ringing current's strength that is consumed by or lost within each foot of this 625 foot long cable is approximately ((127 mA-pp/(625) =0.203 mA-pp or 0.072 mA-rms).]

For a cable which is 312.5 feet in length the combined in series capacity of the Transmitter's two capacitors and the cable's single 0.025 uFD capacitor figure out at a total in series combined capacity of about 0.00416 uFD, which at 11,780 Hz and operating with an inductance of 37.44 mH leaves an additional uncancelled reactance of about 477 ohms. But because of the in series resistive equivalent resistance of 147.7 ohms, produced by the 50 K-ohm resistor in parallel with the 0.005 uFD capacitor within the Transmitter the actual limiting reactance is more like the (Square root of ((477 ohms*477 ohms)+(147.7 ohms*147.7 ohms)))= (Square-root of 248,949 ohms) or 499 ohms. The total amount of 11,780 Hz in quasi resonance signal available for this 312.5 foot long cable is about ((32 V-pp/499 ohms=64 mA-pp or 22.7 mA-rms). This then causes the in series resonance 11,780 Hz Voltage across either the driver transformer's secondary winding's 37.44 mH of inductance or the 0.00416 uFD of combined capacity to appear to be as large as about 178 V-pp or 63 V-rms. The total strength of this in series resonance circuit's ringing current is about ((178 V-pp/ (2*3.1416*37.44 mH*11,780 Hz)=64 mA-pp or 22.7 mA-rms). The amount of the in resonance signal circuit's total ringing current's strength that is consumed by or lost within each foot of this 312.5 foot long cable is approximately ((64 mA-pp/(312.5)=0.204 mA-pp or 0.0726 mA-rms).

From the four different sets of calculations above the level of 11,780 Hz ringing current signal consumed by or lost within each foot of cable averages out at about 0.169 mA-pp or 0.060 mA-rms for any cable lengths between 2,500 feet down to 312.5 feet. However once the cable lengths are under 312.5 feet the amount of in series resonance 11,780 Hz signal's current that is available for conducting any meaningful surveys starts rolling off rapidly. This creates the second of the two reasons for always using this ULF System's associated External Adjustment Box cable lengthening feature. So with any cable's under 350 feet in length the External Adjustment Box's $2^{nd}$ optional capacitive setting of 0.025 uFD should always be used because it alone by itself always creates more than the needed minimum of 312.5 feet of cable to run a successful HRG Fault survey.

The two sets of calculations that come next will illustrate that the ULF Transmitter's superimposed 11,780 Hz secondary frequency only provides a correct-signal type of characteristic to, or for, the Transmitter's 0.718 Hz primary fault finding is frequency because this 11,780 Hz signal by itself exhibits absolutely no HRG Fault finding abilities whatsoever.

At 11,780 Hz for a cable which is about 2,500 feet long, this cable's length produces a circuit whose near perfect in full series resonance condition creates a ringing current of about ((604 V-pp/(2*3.1416*37.44 mH*11,780 Hz)=218 mA-pp or 77 mA-rms). The amount of this in full resonance signal circuit's total ringing current's strength that is consumed by or lost within each foot of this 2,500 foot long cable is approximately ((218 mA-pp/(2,500)=0.0872 mA-pp or 0.031 mA-rms). So when this in series resonant current from the 11,780 Hz portion of the ULF Transmitter's combined signal flows across or through the 0.2 uFD capacity of this 2,500 foot long length of cable it only produces a combined total current's Reactive Voltage of around 14.73 V-pp or 5.2 V-rms, (((Ec-0.2=Ic-0.2*Xc-0.2)=(0.077 A-rms*67.5 Ohms)=5.2 V-rms). Thus a 2.2 Meg-ohm HRG Fault somewhere within this 2,500 foot cable ends up generating about a 0.0024 mA-rms amount of a resistive faults current, (5.2 V-rms/2.2 Meg-ohm=0.0024 mA-rms). When you compare this 0.0024 mA-rms of 11,780 Hz resistive fault current to the 0.031 mA-rms of 11,780 Hz in series resonance reactive current that is loss within every single foot of this 2,500 foot long cable it only represents about 7.4% of what is being lost within each or every foot of that cable. So at 11,780 Hz this 2.2 Meg-ohm HRG Fault's worst case location of being within the first 100 feet of cable that is adjacent to the Transmitter, the combined in series resonance's reactive current's and resistive current's combined total signal strength just before the HRG Fault is about 77.0024 mA-rms, and just beyond that same 2.2 Meg-ohm HRG Fault the remaining reactive current's signal strength is about 77 mA-rms. This represents a change of ((77.0024 mA-rms)/(77 mA-rms)=1.0000312 to 1), which when multiplied by 10,000 yields a ratio of 10,000.312 to 10,000. (At 11,780 Hz this would equate to a TOTALLY INADEQUATE 0.0001354 dB change in the sine wave type audible output as one passed over this 2.2 Meg-ohm HRG Fault.) From this very slight change of 0.0001354 dB or 10,000.313 to 10,000.000 which is only 0.00312% in the 11,780 Hz frequency's signal strength it can be seen that the 11,780 Hz portion of this combined signal plays absolutely no part in the 0.718 Hz portion's only function which is to announce the locations of any of those HRG Faults.]

At 11,780 Hz for a cable which is about 1,250 feet long, this cable's length produces a circuit whose less than optimum series resonance condition creates a ringing current of about ((547 V-pp/(2*3.1416*37.44 mH*11,780 Hz)=198 mA-pp or 70 mA-rms). The amount of the in resonance signal circuit's total ringing current's strength that is consumed by or lost within each foot of this 1,250 foot long cable is approximately ((198 mA-pp/(1,250)=0.158 mA-pp or 0.056 mA-rms). So when this less than optimum in series resonant current from the 11,780 Hz portion of the ULF Transmitter's combined signal flows across or through the 0.1 uFD capacity of this 1,250 foot long length of cable it only produces a combined total current's Reactive Voltage of around 26.75 V-pp or 9.45 V-rms, (((Ec-0.1=Ic-0.1*Xc-0.1)=(0.070 A-rms*135.1 Ohms)=9.45 V-rms). Thus a 1.0 Meg-ohm HRG Fault somewhere within this 1,250 foot cable only ends up generating about a 0.00945 mA-rms amount of a resistive fault's current, (9.45 V-rms/1.0 Meg-ohm=0.00945 mA-rms). When you compare this 0.00945 mA-rms of 11,780 Hz resistive fault current to the 0.056 mA-rms of 11,780 Hz in series resonance reactive current that is loss within every single foot of this 1,250 foot long cable it only represents about 16.9% of what is being lost within each or every foot of that cable. So when working under the worst case's conditions for trying to find a 1.0 Meg-ohm Resistive Fault, (which are when that particular HRG Fault is located within the first 100 feet of the whole 1,250 foot long cable that is immediately adjacent to the ULF Transmitter's location), sets the ratio with series resonance of the 11,780 Hz frequency's reactive and resistive currents that both exist within the first 100 feet before the HRG Fault, to the majority of reactive current that only remains after the HRG Fault, at about ((70.00945 mA-rms)/(70 mA-rms)=1.000135 to 1). (At 11,780 Hz this would equate to a TOTALLY INADEQUATE 0.0005863 dB change in the sine wave type audible output as one passed over this 1.0 Meg-ohm HRG Fault.) By multiplying by 10,000 to get two whole numbers, this equates to the 11,780 Hz combined resistive and reactive current's total signal strength just before the HRG Fault being about 10,001.35, and just beyond the resistive fault the remaining reactive current's total signal strength being about 10,000. Thus from this very slight change of 0.0005863 dB or 10,001.35 to 10,000.000 which is only 0.0135% in the 11,780 Hz frequency's signal strength it should once again be apparent that the 11,780 Hz portion of this combined signal plays absolutely no part in the 0.718 Hz portion's only function which is to announce the locations of any of those HRG Faults. *TMB-12/12/2,006*

The End Connection Circuit

Figure 3:
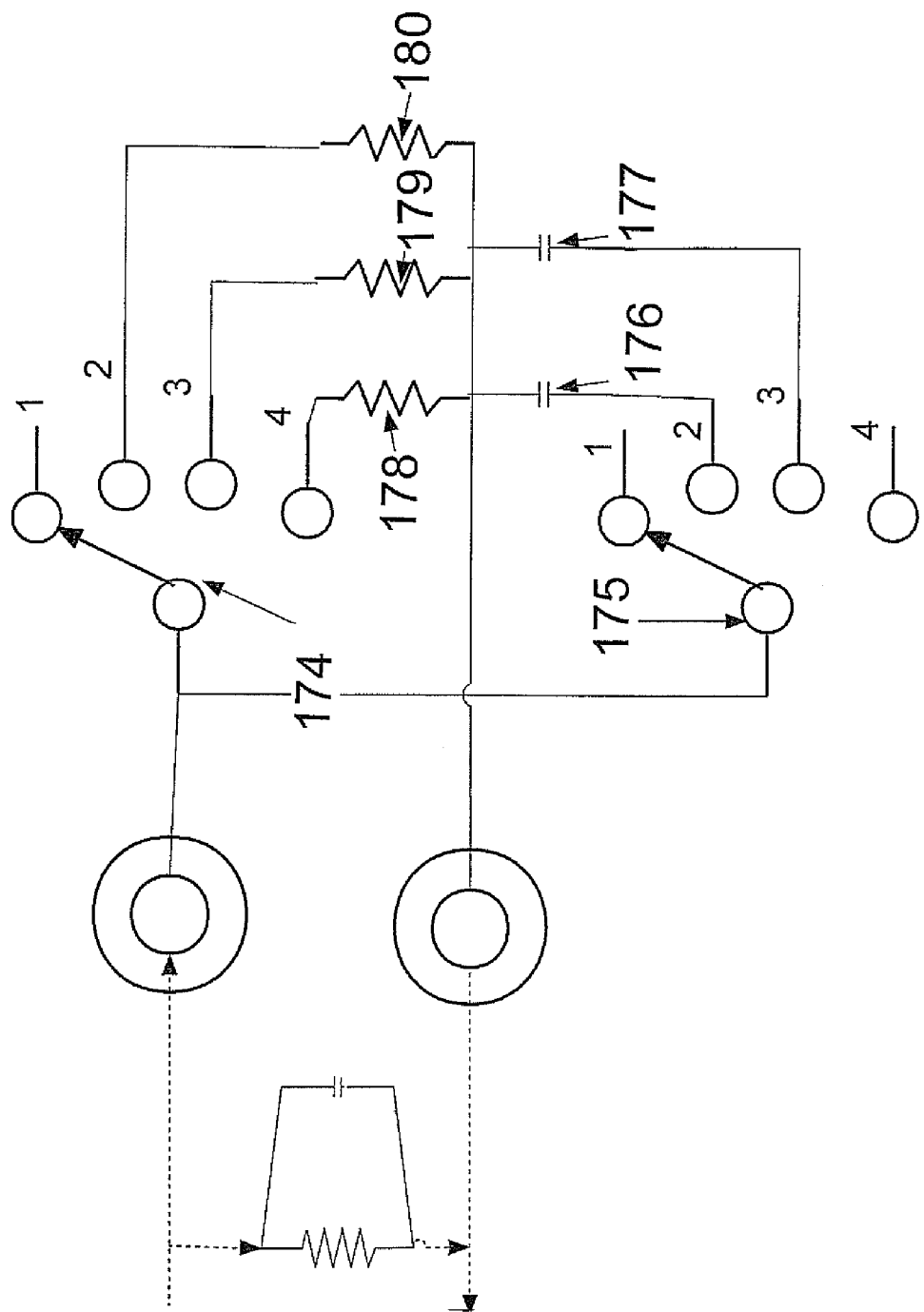
FIG. 3 is a schematic illustration of the end connection circuit of the apparatus of FIG. 1.

Turning now to FIG. 1, the end connection circuit 20 and its connection with the transmitter 19 is shown in more detail. At times within any cable being surveyed with the ULF Transmitter's primary 0.718 Hz fault finding frequency it might be advantageous to be able to have more 0.718 Hz resistive fault current flowing than what that faulted cable's own internal HRG Fault is creating by itself. So whenever more 0.718 Hz resistive fault current would be of some additional assistance it can be so accomplished by using the FIG. 1 end connection circuit 20 to add an additional in parallel external high voltage 20 Watt power resistance 178, 179 and 180 of a 2.2 M-ohm, 3.3 M-ohm, or 4.4 M-ohm value respectively as shown in FIG. 3 to the opposite to end of the cable to which the Transmitter has been connected. This FIG. 1 end connection circuit 20 has a rotary switch 174 as shown in FIG. 3 which is used to select either a 20 watt 2.2 M-ohm, 3.3 M-ohm, or 4.4 M-ohm resistor are made up from either 10-220 K-ohm 2.0 watt, 10-330 K-ohm 2.0 watt, or 10-440 K-ohm 2.0 watt resistors in series on three individual small PC cards or PC boards.

At the Transmitter's secondary 11,780 Hz authenticating-frequency it will always be advantageous to be able to make any faulted cable being surveyed to appear to the Transmitter's 11,780 Hz signal to be at least 125 feet longer than it actually is. By using the FIG. 1 end connection circuit 20 every under survey faulted cable can be made to appear at least 125 feet longer than it actually is. This is always done by adding a small amount of additional parallel capacity to end of the cable which is opposite to the one to which the Transmitter has been connected. By consistently doing this, it ensures that at every cable's far end there is always going to be enough of the Transmitter's 11,780 Hz signal's current still flowing to reproduce an adequate 11,780 Hz signal within the Receiver's 11,780 Hz section. This then in turn allows for the Receiver being able to track the 0.718 Hz fault finding-signal to the absolute far end of any cable whenever its hidden HRG Fault happens to be somewhere within the last 100 feet or so of that cable which is just before its actual physical end. This FIG. 1 end connection circuit 20 uses either a FIG. 3 rotary switch 175 selected 5,000 V-dc 0.01 uFD capacitor 176 to simulate this additional 125 feet of cable, or a 5,000 V-dc 0.025 uFD capacitor 177 to simulate this additional 312.5 feet of cable.

Higher Resistance Ground Faults can be found by using the FIG. 1 end connection circuit 20 to raise the total amount of Resistive Current that is flowing. This is done by, whenever a particular cable has an internal HRG Fault whose value has already been determined to be somewhere between 2.2 Meg-ohms to 4.4 Meg-ohms, the addition of a similar value or even next higher value of external high voltage 20 watt power resistor in parallel with that cable's actual internal one can assist in making that cable's internal resistive fault's position easier to locate. For example when a cable's internal resistive fault's value is greater than 2.2 Meg-ohms but less than 4.4 Meg-ohms, the addition of a second external high voltage power resistor whose value as shown in FIG. 3 is either 2.2 Meg-ohms as shown at 78, 3.3 Meg-ohms as shown at 79, or 4.4 Meg-ohms as shown at 80, at the opposite end of that cable to which the ULF Transmitter is using can nearly double the total value of the 0.718 Hz resistive current flowing. Thus, the total value of the 0.718 Hz resistive current drawn out from the ULF Transmitter that then goes down that faulted buried cable towards the location of its own 2.2 Meg-ohm to 4.4 Meg-ohm internal resistive ground fault goes up from somewhere between 1.02 mA to 0.51 mA without the FIG. 1 end connection circuit 20 to somewhere between 2.04 mA, to 1.02 mA respectively if the second or duplicate resistance has been added in parallel with that faulted cable's own internal one.

The main advantage of adding that second 2.2 Meg-ohm to 4.4 Meg-ohm high voltage power resistor to the appropriate types of faulted cables is that it raises the total value of 0.718 Hz resistive fault current flowing from a value that could have been to low to allow for any reliable detection by the Receiver, to a new nearly two times higher value that is more easily detected and tracked by the Receiver. At the same time it leaves the change in the resistive current value around the cable's internal HRG Fault's location to sometimes be as large as (3.0 dB) or even more.

One of the main disadvantages of adding this second 2.2 Meg-ohm to 4.4 Meg-ohm high voltage 20 watt power resistor to the appropriate types of faulted cables is that once there has been a change in audible signal of somewhere between (2.0 dB to 3.0 dB) around that cable's suspected internal 2.2 Meg-ohm to 4.4 Meg-ohm resistive fault's possible location, and the remaining resistive current that has now dropped by 50% or more, it may no longer allow one to trace or survey that cable any further beyond that point. So whenever this has happened, one should whenever possible try to re-confirm that particular cable's internal HRG Fault's suspected location by reversing the positions of the Transmitter and the FIG. 1 end connection circuit 20 additional resistor and then re-run that survey again to try to prove that the signal still drops out again at the same spot.

Whenever a similar or higher resistance is being used and one ignores the effects of the faulted-cable's 0.718 Hz capacitive reactive current, then when one is at, or has just gone beyond that cable's internal 2.2 Meg-ohm to 4.4 Meg-ohm HRG Fault's location the absolute value of the ULF Receiver's antenna's induced 0.718 Hz resistive current's signal strength changes from somewhere between 2.04 mA to 1.02 mA to somewhere between 1.2 mA, to 0.51 mA. And at the point where this approximate 2.0 to 1.0 drop in the 0.718 Hz resistive current's signal strength has occurred, it is being annunciated by about a −3.0 dB change in the output of the ULF Receiver's audible signal strength.

However because one is always working with the Transmitter's 4,500 V-pp 0.718 Hz semi square wave signal and the same 50.0 K-ohm limiting resistor, every faulted cable's combined capacity always produces a reactive current that can never exist for more than approximately 0.030 seconds or about 4.31% out of each 0.718 Hz half-cycle's total of 0.69637883 seconds. And it is only the same Transmitter's 4,500 V-pp signal and the 50 K-ohm internal limiting resistor that sets everyone of the 0.718 Hz infinite array of variable time constant's to the same 45.0 mA maximum value of start-up-current. For example the Transmitter's 50 K-ohm internal limiting resistor and the 0.20 uFD of capacity of longest 2,500 foot cable's that can be surveyed produce a RC Time constant times three that is about 0.030 seconds in length, (50,000 ohms*0.2 uFD*3=0.030 sec). Thus, for that 2,500 foot long cable its 0.030 second time constant's effects when averaged out over the entire length of each 0.718 Hz half cycle produces an average 0.718 Hz reactive current's effect that is about equivalent to 0.9694 mA, ((45 mA/2) *0.030 sec/0.69637883 sec=0.9694 mA). And for a 1,250 foot length of cable its 0.015 second time constant's effect when averaged out over the entire length of each 0.718 Hz half cycle produces an average 0.718 Hz reactive current that is about the equivalent of 0.4847 mA, ((45 mA/2)*0.015 sec/0.69637883 sec=0.4847 mA).

When, or if, a cable's internal fault resistance is 3.3 Meg-ohms and the FIG. 1 end connection circuit 20 additional external 20 watt high voltage power resistance is also set at the same 3.3 Meg-ohms the transmitter's 0.718 Hz semi-square wave signal creates a total resistive current of approximately 1.36 mA, (2.25E3 Volts/1.65E6 ohms=1.36 mA). And when, or if, a cable's internal fault resistance is 3.3 Meg-ohms and the FIG. 1 end connection circuit 20 additional external 20 watt high voltage power resistance is set at 4.4 Meg-ohms the Transmitter's 4,500 V-pp 0.718 Hz semi-square wave signal creates a total resistive current of approximately 1.19 mA, (2.25E3 Volts/1.886E6 ohms=1.19 mA).

So when using the FIG. 1 end connection circuit 20 set to its own 3.3 Meg-ohm 20 Watt high voltage resistor on a 2,500 foot cable to try to find a 3.3 Meg-ohm internal fault resistance that is located somewhere within the first 100 feet of cable nearest the Transmitter, the signal change around this internal 3.3 Meg-ohm fault's location is about ((1.36 mA+0.9694 mA)/(0.68 mA+0.9694 mA)=1.41 to 1). This only creates about 1.5 dB of an audible-change in the Receiver's output as one passes over this 3.3 Meg-ohm HRG Fault. When using the same FIG. 1 end connection circuit 20 set to its own 4.4 Meg-ohm 20 Watt high voltage resistor on a 2,500 foot cable to try to find a 3.3 Meg-ohm internal fault resistance that is located in the first 100 feet of cable nearest the Transmitter, the signal change around this internal 3.3 Meg-ohm fault's location is about ((1.193 mA+0.9694 mA)/(0.511 mA+0.9694 mA)=1.46 to 1). This only creates about 1.645 dB of an audible change in the Receiver's output as one passes over this 3.3 Meg-ohm HRG Fault.]

Then when using the FIG. 1 end connection circuit 20 set to its own 3.3 Meg-ohm 20 Watt high voltage resistor on a 2,500 foot cable to try to find a 3.3 Meg-ohm internal fault resistance that is located about 1,250 feet away from the Transmitter, (or on a 1,250 foot cable to try to find a 3.3 Meg-ohm internal fault resistance that is located in the first 100 feet nearest the Transmitter), the signal change around either of these two internal 3.3 Meg-ohm fault's locations are both ((1.36 mA+0.4847 mA)/(0.68 mA+0.4847 mA)=1.58 to 1). This creates about 1.99 dB of an audible change in the Receiver's output as one passes over this 3.3 Meg-ohm HRG Fault. When using the same FIG. 1 end connection circuit 20 set to its own 4.4 Meg-ohm 20 Watt high voltage resistor on a 2,500 foot cable to try to find a 3.3 Meg-ohm internal fault resistance that is located about 1,250 feet away from the Transmitter, or on a 1,250 foot cable to try to find a 3.3 Meg-ohm internal fault resistance that is located in the first 100 feet nearest the Transmitter), the signal change around either of these two internal 3.3 Meg-ohm fault's locations are both ((1.193 mA+0.4847 mA)/(0.511 mA+0.4847 mA)=1.685 to 1). This creates about 2.26 dB of an audible change in the Receiver's output as one passes over this 3.3 Meg-ohm HRG Fault.

However, when or if the Transmitter had been connected to the same cable so that the HRG Fault was located in the last 100 feet of that cable which is just before its far end and its connection to the external high voltage power resistor of the FIG. 1 end connection circuit 20, then the change in the audible signal at the location of that internal HRG Fault would be improved as follows:

When using the FIG. 1 end connection circuit 20 set to its own 3.3 Meg-ohm 20 Watt high voltage resistor on a 2,500 foot cable to try to find a 3.3 Meg-ohm internal fault resistance that is located in the last 100 feet furthest from the Transmitter, the signal change around this internal 3.3 Meg-ohm fault's location is ((1.36 mA+0.0387 mA)/(0.68 mA+0.0387 mA)=1.946 to 1). This then creates a substantially better 2.89 dB of audible change in the Receiver's output as one passes over this 3.3 Meg-ohm HRG Fault. When using the same FIG. 1 end connection circuit 20 set to its own 4.4 Meg-ohm 20 Watt high voltage resistor on a 2,500 foot cable to try to find a 3.3 Meg-ohm internal fault resistance that is located in the last 100 feet furthest from the Transmitter, the signal change around this internal 3.3 Meg-ohm faults location is ((1.193 mA+0.0387 mA)/(0.511 mA+0.0387 mA)=2.24 to 1). This then creates a substantially better 3.50 dB of audible change in the Receiver's output as one passes over this 3.3 Meg-ohm HRG Fault. And when using the FIG. 1 end connection circuit 20 set to its own 3.3 Meg-ohm 20 Watt high voltage resistor on a 1,250 foot cable to try to find a 3.3 Meg-ohm internal fault resistance that is located in the last 100 feet furthest from the Transmitter the signal change around this internal 3.3 Meg-ohm fault's location is ((1.36 mA+0.0387 mA)/(0.68 mA+0.0387 mA)=1.946 to 1). This also creates a substantially better 2.89 dB of audible change in the Receiver's output as one passes over this 3.3 Meg-ohm HRG Fault. When using the FIG. 1 end connection circuit 20 set to its own 4.4 Meg-ohm 20 Watt high voltage resistor on a 1,250 foot cable to try to find a 3.3 Meg-ohm internal fault resistance that is located in the last 100 feet furthest from the Transmitter the signal change around this internal 3.3 Meg-ohm fault's location is ((1.36 mA+0.0387 mA)/(0.511 mA+0.0387 mA)=2.24 to 1). This also creates a substantially better 3.50 dB or more audible change in the Receiver's output as one passes over this 3.3 Meg-ohm HRG Fault]

It is possible to search out the entire length of most faulted cables by always using the FIG. 1 end connection circuit 20 to add more capacity or an additional length to that cable. Thus on any or every faulted cable being surveyed for the precise location of its already known to exist HRG Fault there is never going to be enough of the 11,780 Hz part of the Transmitter's dual frequency signal present towards the cable's far end to allow the ULF Receiver to successfully complete a survey of that cable for the location of its internal HRG Fault all the way to that cable's far end. So because this is consistently the case, the FIG. 1 end connection circuit 20 should always be used to add an extra 0.01 uFD of capacity, (or about 125 feet of simulated fault free extra cable), to every cable that is over 350 feet in length, and/or 0.025 uFD of capacity, (or about 312.5 feet of simulated fault-free extra cable), to any cable that is under 350 feet in actual length.

So on every cable regardless of its length, one of the two extra capacities of this FIG. 1 end connection circuit 20 will always be added to the cable's end opposite to one to which the Transmitter has been connected. Then within, or for, the 11,780 Hz portion of the Transmitter's dual combined signal this is equivalent to adding either an extra 125 or 312.5 feet of known to be flaw free cable's signalling effect's that still continue to exist at that cable's actual physical end. This action ensures that there is always going to be at least 3.1 mA-rms or more of a 11,780 Hz signal current left or still flowing at the physical far end of every cable. This remaining minimum of at least 3.1 mA-rms then goes beyond that cable's absolute physical end into the capacitor of the FIG. 1 end connection circuit 20, and while it is doing this it is still inducing its 11,780 Hz magnetic signal into the Receiver's antenna coil which is then being processed and used by the Receiver's 11,780 Hz Section to produce the associated 0.718 Hz signals 184 Hz and 368 Hz audio output tones whenever the HRG Fault is somewhere within the last 100 feet of that cable's length.

The ability of the FIG. 1 end connection circuit 20 to add an extra 312.5 feet of length to any cable that is under 350 foot in length has the additional advantage of raising the whole 11,780 Hz portion of the Transmitter's dual-frequency signal in an ever increasing way the more any particular faulted cable's length departs from the 11,780 Hz series resonant circuit's range's workable lower physical length's limit of approximately 350 feet.

The Receiver

Figure 4:
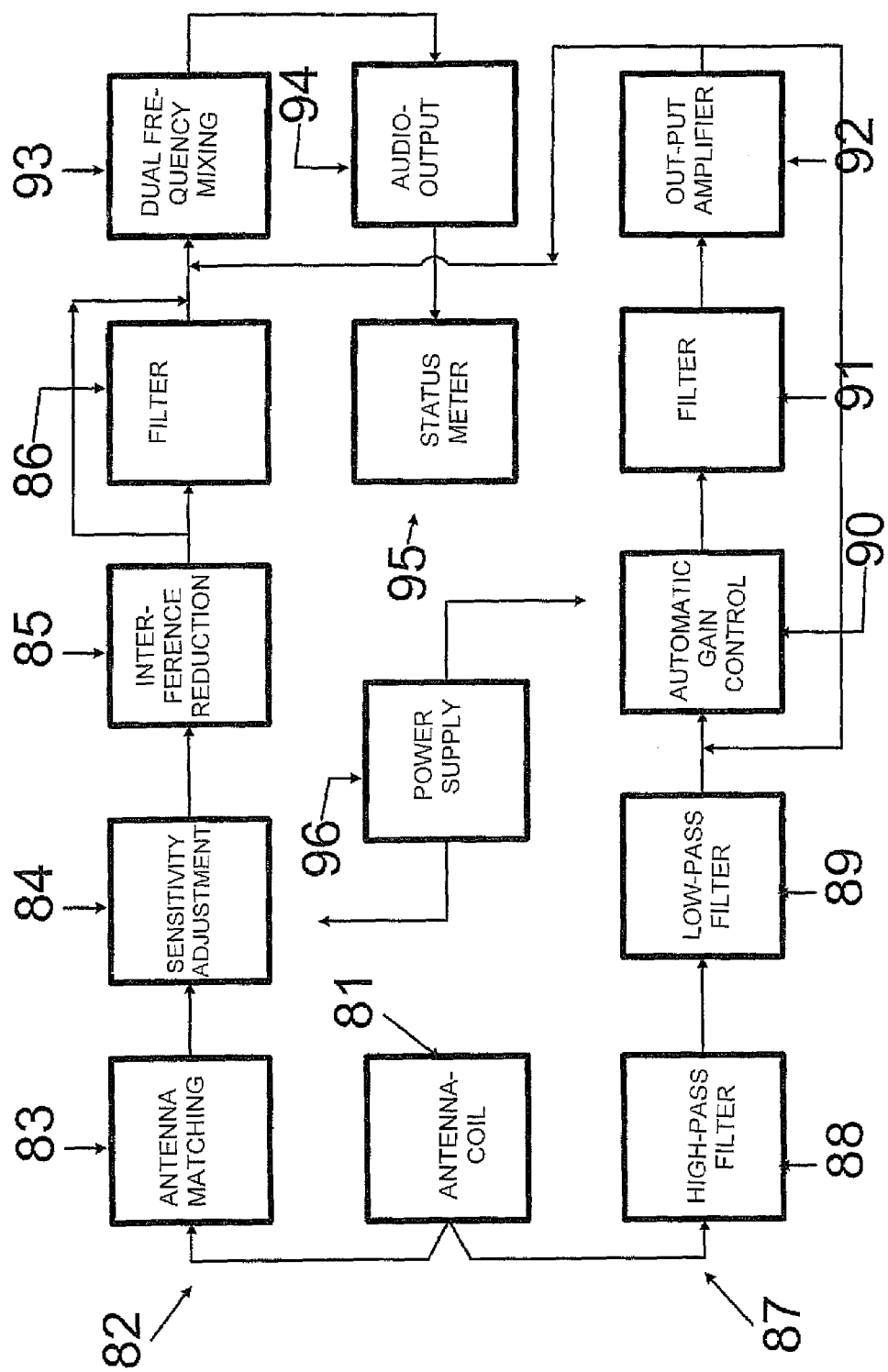
FIG. 4 is a schematic illustration of the receiver of the apparatus of FIG. 1.

Turning now to FIG. 4, the block diagram of the Receiver is shown. The receiver shown in FIG. 4 comprises a balanced three terminal center tapped antenna coil 81 which receives the electromagnetic signal from the underground location. The receiver is mounted on a suitable transport system so that it can be rolled or carried over the ground along the path of the cable. The antenna is arranged to receive both the low frequency and high frequency signals and transfers the low frequency signal through a pathway 82 for processing of that signal through stages 83 to 86.

The high frequency signal is transferred through a path 87 for processing of that signal which passes through stages 88, 89, 90 and 91 together with a further stage 92.

The signals from the stages 86 and 92 are mixed in a further stage 93 which provides a dual frequency mixing and/or conversion stage. From this stage 93, the mixed signals are transferred to an audio output stage 94 and from there to a further stage 95 which provides an earphone speaker and signal strength and battery charge status meter.

The system is powered by a power supply 96.

By reviewing the Receiver's entire basic block and/or logic diagram from a conceptual angle it can be seen that in its most basic form the whole Receiver functions as an interlocked and interdependent collaboration between its low frequency Section and its 11,780 Hz Section. It is within the fifth-stage 93 of the Receiver's ULF Section where all the interlocked and interdependent collaboration between the ULF Section and the 11,780 Hz Section actually takes place. This ULF Section's fifth-stage 93 is were the 0.718 Hz and the 11,780 Hz signals which have both been derived from the ULF Transmitter's combined output signal get proportionally converted on the basis of the strength of the 0.718 Hz signal into two different audible tone bursts. Finally those two different audible tone bursts are then combined into a single signal and used to drive the Receiver's earphone/speakers and signal strength meter 95.

The first four opening stages 83, 84, 85 and 86 of the Receiver's ULF Section are really nothing more than an ultra low frequency pass band amplifier. The entire first four opening stages of the ULF Section has a forward gain at 0.718 Hz which can be manually adjusted anywhere between a low of 4,000,000 to high of 40,000,000, (this is the equivalent of +66 dB to +76 dB).

Similar to the ULF Section, the opening-stages 88, 89, 90 and 91 of the Receiver's 11.780 Hz Section are also nothing more than an audible frequency type of pass band amplifier. The forward gain of the whole 11,780 Hz Section is internally self regulated by a slightly time delayed type of automatic gain control. Overall it shares many of the same mechanical facilities that are used by the ULF Section. In a bit more detail, it is the fifth-stage 93 of the Receiver's ULF Section's that uses what was originally the Transmitter's superimposed 11,780 Hz frequency to eventually produce its audible dual tone output signal which is at any and/or every instant always and only based on whatever the received strength of the 0.718 Hz portion of the Transmitter's combined signal had been at the time of its being imputed into this fifth-stage's conversion process. Also any or all of this only happens whenever both the 0.718 Hz and 11,780 Hz frequencies are both contained within the Receiver's antenna's induced signal's pick-up. Both the proportionally correct 184 Hz and 368 Hz tone bursts that have been made on the even or odd half-cycle basis from whatever the instantaneous value of the 0.718 Hz signal had been at the time it had appeared at the input to this ULF Section's fifth-stage. This Receiver's fifth-stage's resulting unmistakable dual tone output signal allows for both tracing the faulted underground cable's path, and then hopefully finding on that cable any of the associated High Resistance Ground Fault's exact geometric locations.

This ULF Receiver's antenna's coil 81 is a three terminal center tapped and balanced one with 0.5 Henrys or more of inductance. Its inductance is non-resonated at 0.718 Hz and series resonated at 11,780 Hz. The two separate overall gains of the ULF Receiver is such that the maximum induced voltages needed at the 0.718 Hz or the 11,780 Hz frequencies is around 4.0 uV-pp or 0.000004 V-pp. This center tapped and balanced coil is approximately 11.4 centimetres or 4.5-inch long. This coil is symmetrically centered on a ferrous core that has a length of approximately 70 centimeters or 27.56 inches and a minimum cross section area of approximately 6.45 square centimeters or 1.0 square inches. Because it is not illustrated with a basic sketch of this antenna the ferrous core and its coil are going to be rigidly constrained or held within a magnetically neutral thin walled plastic housing which itself has been enclosed within an open frame type of wooden case. This wooden case is going to be outfitted on each of its two ends with a non-metallic and magnetically neutral wheel that is equipped with a rim of a rubber-like type of material. The wheels are mounted in such a manner as to give the bottom of the antenna's case at least a 2.54 centimeters or 1.0 inch clearance above the ground. This antenna's case also has a detachable pushing handle that is about 122 centimeters or 48 inches long. Thus, the whole antenna's net appearance and/or configuration are somewhat similar to that of a small push broom on wheels.

The main reason for this antenna's somewhat awkward size and appearance is its need for having a very good signal gathering capability at the primary 0.718 Hz ultra low frequency it is going to be working with. Thus, when operating at this ultra low frequency both dictates the size of this antenna's ferrous core and also gives the whole antenna its relatively large mass and strange appearance.

When the antenna's size and mass is combined with every operator's need for easy use, this results in the antenna using its left and right end wheels and its at a 45 degree angled long push broom type handle. Also, to further enhance every operator's overall easy use of this whole ULF System, the Receiver's case is designed to allow for its being easily connected to and/or easily disconnected from the upper free end of the antenna's detachable push-broom type handle. These additional features allow the ULF Receiver to easily be used both electronically and mechanically.

This opening stage's Antenna matching function is the first block 83 shown within the ULF Section of the Receiver's basic block and/or logic diagram. The three-terminal center tapped and balanced features of the ULF Receiver's antenna coil when combined with the non-resonant fully differential capacitive coupling nature of this ULF Section's opening antenna matching stage, are the best way of inputting the 0.718 Hz part of the antenna coil's two different signal frequencies into the ULF Section of the Receiver. This antenna matching stage's band pass has been so designed that only the ultra low frequency part of the antenna coil's two balanced or differential signal components gets amplified and eventually converted into single ended non-differential voltage at the output of this opening stage. Internally this whole antenna matching stage uses four different low noise operational amplifiers. This ULF Section's opening antenna matching stage 83 is only the first out of a total of the first four ULF stages that when taken together make up the not precisely tuned front end portion of this Receiver's ULF Section. Within its limited band pass of approximately 0.20 Hz to 2.0 Hz this first antenna matching stage develops a forward gain at 0.718 Hz of approximately 28 or, (+14.0 dB) and a negative forward gain at 60 Hz of approximately 0.055 or (−12.5 dB).

This second stage's Sensitivity adjustment function is the second block shown 84. The ULF Section's sensitivity adjustment stage's first of its two op-amps provides the means by which the antenna matching stage's output's differential signal is converted into a single ended one. This first op-amp also adds an additional 0.718 Hz signal's increase in gain of approximately 78 or (+18 dB). At this point the difference between any wanted 0.718 Hz signal's accumulated gain increase of approximately 2,000 or (+33 dB), and any unwanted 60 Hz or 50 Hz power line frequency's accumulated loss has now grown to approximately (−45.5 dB). This difference of approximately (−45.5 dB) is because of all the roll-offs from the accumulating positive and negative gain factors.

Now the second of this sensitivity adjustment stage's two op-amps is used to further amplify this single ended not precisely tuned 0.2 Hz to 2.0 Hz output voltage that originated from the antenna to a level that the Receiver's operator has decided is appropriate for surveying the particular faulted buried cable that they presently happen to be working on. This is done electronically via the manual rotation of a 10 K-ohm potentiometer which then varies this second low noise operational amplifier's net 0.718 Hz signal's gain by another factor of 10 to 100, or an additional (+10 dB to +20 dB). Within what is the commonly shared 0.2 Hz to 2.0 Hz pass band of the ULF Section's first two stage's their total combined amplification now produces an overall forward gain at the frequency of 0.718 Hz that is manually adjustable anywhere between a low of 20,000 or, (+43 dB) to a high of 200,000 or (+53 dB). At 60 Hz or 50 Hz this second op-amp's negative forward gain is approximately 0.067, this is a very slight improvement of (−11.7 dB−(−12.5 dB)=+0.8 dB). However the accumulated difference between any wanted 0.718 Hz type signal and any unwanted 60 Hz or 50 Hz power line frequency has now grown to approximately (−53.9 dB to −63.9 dB). Also, the opening most counter clockwise parts of this sensitivity stage's 10 K-ohm potentiometer's shaft's approximately 270 degrees of mechanical rotation are used to provide the On/Off-Switch function for the whole Receiver.

The third stage's Interference reduction function is shown as the third block 85 within the ULF Section of the Receiver's basic block and/or logic diagram. With the variable output from the ULF Section's second manually adjusted sensitivity stage having now been amplified by something between, (+43 dB to +53 dB), suggests, if not requires, the use of a 60 Hz or a 50 Hz notch filter, whose actual operating frequency is selected by the mechanical movement of a switch. Thus either this North American 60 Hz, or European 50 Hz, switch selected notch filter is going to be used to reduce whatever power line induced interference might still persist in spite of the antenna's and the first and second stage's 0.2 Hz to 2.0 Hz pass band's combined negative gain or rejection of something like (−53.9 dB to −63.9 dB) by an additional factor of at least ¼ or (−6.0 dB).

This notch filter's specialized function will require the use of four of the five different low noise operational amplifiers internally used within this third stage. The forward gain remains at 1.0 or, (0.0 dB) throughout all of the non-filtered frequency regions of this 60 Hz or 50 Hz notch filter stage's 0.2 Hz to 2.0 Hz pass band. So what either of these two switch selected notch filters only really do with their Q of approximately 20, is reduce whatever power line's 60 Hz or 50 Hz interference might still persist at the input of this third stage by an amount of something approaching 0.25 or, (−6.0 dB). So at the output of this third stage's switch selected 60 Hz or 50 Hz notch filtering, it has raised the overall power frequency's negative gain or rejection to somewhere between a low of 1/1,174,897 to a high 1/11,748,975 or, (−59.9 dB to −69.9 dB). At the output of this 60 Hz or 50 Hz notch filter the 0.718 Hz forward gain is 1.0 or (0.0 dB), whereas the 60 Hz or 50 Hz per stage negative gain has increased from the its former 0.066 to 0.0167 or by an additional (−6.0 dB).

Within this third stage's final, or fifth, low noise operational amplifier the 0.718 Hz frequency part of the whole 0.2 Hz to 2.0 Hz pass band undergoes another additional amplification of 100 or, (+20 dB). On the other-hand the 60 Hz or 50 Hz part of the spectrum beyond the 0.2 Hz to 2.0 Hz pass band only experiences a very slight improvement in its notch filter's output's negative forward gain of 0.0167 to 0.02, which is (−16.9 dB−(−17.76 dB)=+0.86 dB). So at 60 Hz or 50 Hz the fifth operational amplifier of this third stage further enhances the combined the total negative gain or roll off differences of the antenna's ULF capacitive coupling's and the first two ULF stage's 0.2 Hz to 2.0 Hz pass band with its own or the third repeat of the same 0.2 Hz to 2.0 Hz band pass. Overall this provides about another, (−20 dB+0.83 dB)=−19.17 dB), of enhancement to all of the preceding stage's three earlier 0.2 Hz to 2.0 Hz pass band's differences that existed between the 0.718 Hz forward gain figure and the 60 Hz or 50 Hz negative gain figure.

Within the 0.2 Hz to 2.0 Hz band pass of all these opening three stages, and depending on the manual setting of the ULF Section's second stage's sensitivity control, any 0.718 Hz signal's net forward gain that is being produced at the output of this third stage's fifth op-amp is approximately 2,000,000 to 20,000,000, (+63 dB to +73 dB). On the other hand at either one of the two switch selected 60 Hz or 50 Hz notch filter center points, (which are both at least 4.5 octaves or more higher in frequency than the upper corner frequency of the 0.2 Hz to 2.0 Hz pass band), this third stage's fifth op-amp adds about another 1/83 or, (−19.17 dB), of attenuation to all the earlier pass band's and notch filter's negative gain factor's differences at either of the 60 Hz or 50 Hz power line frequencies. So at the output of this fifth op-amp within the third stage the combined total differences between the positive amplification of any 0.718 Hz signal's strength and the unwanted 60 Hz or 50 Hz negative amplification of its signal's strength now approach something like 1/79,432,823 to 1/794,328,234 or, (−79 dB to −89 dB).

Finally, through the use of a resistive divider chain a scaled down portion of this third stage's fifth operational amplifier's unfiltered 0.2 Hz to 2.0 Hz pass band's output signal, (+63 dB to +73 dB), which is in part if not mainly a 0.718 Hz one, is used to drive the base emitter junction of an NPN transistor. This NPN transistor's collector emitter junction then provides the ULF Section of the Receiver with its first level or primary type of squelching action. This is done by always having enough 0.2 Hz to 2.0 Hz signal present at this point to keep pin 11 of the ULF Section's fifth stage's and the 11,780 Hz Section's associated CMOS binary divider low. More details about this whole NPN transistor's function are found under the ULF Section's fifth stage's description.

The fourth block 86 within the ULF Section of the Receiver's basic block and/or logic diagram represents the fourth stage's Correct frequency characteristic function.

The ULF Section's fourth stage only allows for one specific part of all the different frequencies within the 0.2 Hz to 2.0 Hz pass band that may have now passed through all of the ULF Section's first three stage's to get through, and then go beyond, this fourth correct Ultra Low Frequency stage. To be more specific, the only part of any signal that can get through this fourth stage must have the same precise-timing and exact symmetry as what is only found within the 0.718 Hz portion of the ULF Transmitter's combined output-signal. This highly discriminatory degree of screening is accomplished within the fourth stage by using a very narrow band width high Q frequency filter which is centered on 0.718 Hz.

The Receiver uses an active type of 0.718 Hz filtering, whereas an even higher Q type of digital filter can be used within any production versions of the ULF Receiver. The fabrication of this ULF Section's fourth stage's high Q, 0.718 Hz, active filter will employ the use of three low noise operational amplifiers. This 0.718 Hz active filter has a forward gain of 1 or (0.0 dB), and a Q that measures somewhere between 60 to 80. At a Q of 60 or 80 the (−3.0 dB) down points of this very narrow band width 0.718 Hz filter are respectively a low of 0.7130 Hz or 0.7145 Hz and a high of 0.7250 Hz or 0.7235 Hz. It is the high Q of this fourth stage's very narrow bandwidth 0.718 Hz filtering door that forces the remainder of the ULF Receiver to be totally dependent upon a 0.718 Hz frequency component being present within any signal that is going to be processed any further. With its exclusive dedication to the single 0.718 Hz frequency requirement of this fourth stage's filtering door, (with its Q of 60 to 80 and an internal gain of 1.0 or (0.0 dB)), only signals with frequencies somewhere between a low of 0.713 Hz to a high of 0.725 Hz will still retain most of what has now become this very narrow pass band fourth stage's output's version of the ULF Section's first three stage's original 0.2 Hz to 2.0 Hz band width's forward gain factor of 2,000,000 to 20,000,000 or, (+63 dB to +73 dB).

Also at the output of this fourth-stage what had originally been the third stage's 60 Hz or 50 Hz notch filter's maximum total of around 1/794,328,234 or (−89 dB) of difference between it and the wanted 0.718 Hz has now most likely been increased further by about another additional (−33 dB to −36 dB) because of this filter's sharp attenuation. Thus, at the output of the ULF Section's fourth stage the reproduction of any 60 Hz or 50 Hz power line's magnetically induced interference has now undergone a difference between its total negative amplification and the 0.718 Hz signal's positive amplification that may now be as high as 1/158,489,319,200 to 1/1,622,776,600,000 or, (−112 dB to −125 dB).

So at this point with the receiver's minimum forward gain setting of 2,000,000 the net 60 Hz or 50 Hz attenuation figure is at about (−49 dB) compared to 0.718 Hz (+63 dB) signal level, ((+63 dB)+(−112 dB)=−49 dB), and at the receiver's maximum forward gain setting of 20,000,000 the net 60 Hz or 50 Hz attenuation-figure is at about (−52 dB) compared to 0.718 Hz (+73 dB) signal level, ((+73 dB)+(−125 dB)=−52 dB). *TMB 13/12/2,006*

The fifth stage which acts to convert some of the real 0.718 Hz outputs from the transmitter into two consistent but different audible tones function is the fifth block 93 shown within the ULF Section of the receiver. In this fifth stage 93 any antenna's persistently repeating pick-up of the fault-finding 0.718 Hz signal that does not also have a persistently repeating pick-up of the associated confirming 11,780 Hz signal with it that happens to get through to the first of the two primary inputs of the fifth stage will not get outputted from it. Similarly, any antenna's persistently repeating pick-up of the associated confirming 11,780 Hz signal that doesn't also have a persistently repeating pick-up of the essential fault finding 0.718 Hz signal with it that happens to get through to the second of the two primary inputs of the fifth stage will also not get outputted from it. However, any antenna's persistently repeating pick-up of the fault finding 0.718 Hz signal that is above a required minimum level and that also has a persistently repeating pick-up of the associated confirming 11,780 Hz signal with it that gets through to the first of the two primary inputs of this fifth stage will get any or all of its so being confirmed as qualified 0.718 Hz positive and negative half cycle phases proportionally converted into positive half-cycle 184 Hz tones and inverted negative, (positive), half-cycle 368 Hz tones respectively.

To do all of this, the ULF Section's fifth stage is equipped internally with four low-noise operational amplifiers, four analog switches, and one CMOS binary divider. This fifth stage uses the 184 Hz and the 368 Hz square wave outputs from its CMOS binary divider, (which only happen when or if it is being clocked, or driven, by a 11,780 Hz square wave output from the ULF Receiver's 11,780 Hz Section), plus all of the other previously mentioned devices to accomplish the proportionally correct 0.718 Hz sub-audio to 184 Hz and/or 368 Hz audible tone conversions that are done.

And even though the ULF Receiver's CMOS binary divider's 368 Hz and 184 Hz square wave outputs are within 6.0 Hz and/or 4.0 Hz of the 6th and 3rd harmonics of 60 Hz, and a more distant 18 Hz and 34 Hz from the 7th and/or 3rd harmonics of 50 Hz, they have both only been produced internally from the Receiver's CMOS binary divider's division of the output from the Receiver's highly filtered 11,780 Hz Section as opposed to having been being produced from some of the harmonics from any power lines interference which is now probably more than (−112 dB to −125 db) below any of the outputs from this CMOS binary-divider. Before ever having considered the above mentioned as being feasible or a possibility it should be noted that the Receiver's 11,780 Hz Section's signal itself is somewhere around midway between the 196th and the 197th harmonics of 60 Hz, ((11,780 Hz)/(60 Hz)=196.334), and/or about midway between the 235th and the 236th harmonics of 50 Hz, ((11,780 Hz)/(50 Hz)=235.6). So it is almost next to impossible that any of these 368 Hz or 184 Hz square wave tones could have ever have been being produced from some higher harmonic interference that had started from or because of an induced 60 or 50 Hz Power line type of signal. And because the Receiver's 384 Hz and 184 Hz square wave signals have both only been internally produced from the binary division of the secure 11,780 Hz signal source, as opposed to having been produced from some induced power-line noise's harmonic interference that has been picked up by the Receiver's antenna, their relative proximity to any of the harmonics of the 60 Hz or 50 Hz power line's frequencies cannot be considered as anything more than just a mere coincidence.

The fifth stage's filtered 0.718 Hz input signal from the output of the fourth stage's high Q 0.718 Hz filter is both inverted and amplified by a factor of 2.0, or (+3.0 dB), by the first of the last two op-amps used within the fourth 0.718 Hz filter stage. Then this first of the two closing op-amp's resulting now 2.0 times larger positive half cycle's signal is used as the first of the two 0.718 Hz proportional controlling or analog inputs to the first of the fifth stage's four different analog switches. At the same time this first of the two closing op-amps in the fourth 0.718 Hz filter stage's negative going half cycle's signal is inputted into the fourth stage's second or last of its two closing op-amps. This final of the two closing op-amps of the fourth 0.718 Hz filter stage has had its forward gain set at 1, or (0.0 db). The output from the final of the fourth 0.718 Hz filter stage's two closing op-amps is then used as the second of the two 0.718 Hz proportional controlling or analog inputs to the second of the fifth-stage's four different analog switches. At this point both of these two proportional 0.718 Hz controlling analog inputs have undergone a total amplification from the antenna's opening 0.718 Hz signal-level of somewhere between 4,000.000 to 40,000,000, or (+66 dB to +76 dB).

These first two analog switches perform any or all the proportional correct sub-audio 0.718 Hz to audible 368 Hz and 184 Hz frequency conversions that get done within this ULF Section's fifth stage. This mixing or modulation is done by using the fifth stage's binary divider's 184 Hz and/or 368 Hz square wave output's highs and lows as the two ON and OFF regulating voltages for these first two analog switches. Thus, any or all of the proportionally correct, analog mixed, 184 Hz and/or 368 Hz tone encoding outputs that have resulted from one of the two originally opposite polarity but now both positive going 0.718 Hz half cycle sub-audio analog inputs have only been so produced by one or the other of the 1st or the 2nd of the four analog switches.

Both of the fourth 0.718 Hz filter stage's two highly filtered 0.718 Hz half cycle inputs into this fifth stage after a 2.0 times amplification and/or inversion into a positive going half cycle by the last of the fourth-stage's two closing op-amps ends up being directly converted into a proportionally correct positive going analog tone burst at either a 184 Hz or a 368 Hz frequency. These two different 184 Hz and/or 368 Hz proportionally accurate tone bursts, which still remain separate after they have been outputted from those first two analog switches, are next required to both meet a second, or another, minimum amplitude type of squelch test before they are passed out of this fifth stage and on to the sixth stage's output amplifier. That sixth stage's output amplifier is what is eventually used to drive the ULF Receiver's set of earphone/speakers and a meter that can with a slide switch be set to display either a signal strength reading or a battery charge status reading.

But before this second minimum amplitude type of squelch test just mentioned above can take place each of what had been the two originally separate positive going non-tone converted 0.718 Hz half cycle waveforms at the inputs of this fifth stage's 1st and 2nd analog switches are both used again in another non-inverting amplification of 6.7, or (+8.26 dB), using one of the fifth stage's two operational amps. After both of those two separate still positive going 6.7 times amplifications have taken place, the two resulting enlarged 0.718 Hz half cycle waveforms are used as the two different PASS or DON'T-PASS regulating voltages for the 3rd and 4th of the four analog switches. By using both of these two positively going but different now 6.7 times more amplified 0.718 Hz analog voltages as the controlling voltages for the 3rd and 4th of the fifth stage's four different analog switches makes each of those last two analog switches into two separate and independent squelch controls for each of the other two proportionally correct but non-amplified 184 Hz and the 368 Hz tone bursts that are at the same time being alternately inputted at the original 0.718 Hz frequency's positive or negative half cycle rates into the 3rd and the 4th analog switches as their two analog inputs.

Under these squelch control conditions whenever either of these two different but still proportionally correct 0.718 Hz half cycle 6.7 times amplified PASS or DONT-PASS regulating voltages happens to be below its particular analog switch's ON or THROUGH-PUT threshold, this then prevents either that 3rd or that 4th analog switches non-amplified but also still proportionally correct 184 Hz or 368 Hz tone burst's analog input from being passed through, or going beyond, that so effected 3rd or 4th analog switch. Thus either, or any, so affected 184 Hz and/or 368 Hz tone burst does not get forwarded on as one of the two different tone burst inputs to the ULF Section's sixth stage's output amplifier and its output's driven earphone speakers and/or signal strength meter. Also, depending on what had been the operator's original setting of the ULF Receiver's sensitivity control, this secondary type of squelching may also enhance or exaggerate any drop or change in the 0.718 Hz signal level that is greater than, (−3.0 dB), as the receiver is carried beyond the actual location of any High Resistance Ground Fault that was being searched for.

So during a survey on a particular buried cable for a previously measured for and now known to be existing high resistance ground fault of say 2.2 Meg-ohms, the operator would set the ULF Receiver's second stage's manual-sensitivity to its so designated 2.2 Meg-ohm fault setting. This in turn then sets the fifth stage's 3rd or that 4th analog switches two minimum secondary squelch settings for that particular buried cable's known to be a 2.2 Meg-ohm resistive fault current at a signal level that is the equivalent of 0.80 mA-peak, (2,250 V-peak/0.0008 mA-peak=2,812,500 ohm). On average this then equates to both the 3rd and the 4th analog switch's secondary squelching level being set at a point that is at least 0.2 mA-peak or 20% below the 1.0 mA-peak of the 0.718 Hz resistive fault's signal current that is actually being produced by that 2.2 Meg-ohm HRG Fault, IE: (2,250 V-peak/2,200,000 ohm=0.001022 Amps-peak or 1.022 mA-peak). Similar conditions would exist if the operator was looking for an already known because of a previously measurement to be a resistive fault of 1.0 Meg-ohms and had then set the ULF Receiver's manual sensitivity to or at its so designated 1.0 Meg-ohm setting.

As has already been mentioned in the last paragraph of the ULF Section's third stage, the primary or first level for any inadequate induced signal's squelching or suppression is obtained from using a resistive divider's scaled down version of whatever the instantaneous unfiltered output signal is within the 0.2 Hz to 2.0 Hz pass band of that third stage to keep, or to at least try to keep, the ULF Section's fifth stage's CMOS binary divider continuously running. Whenever this third stages unfiltered 0.2 Hz to 2.0 Hz band passes output is to low some squelching occurs because any, or all, of the fifth stage's binary divider's running only happens when that CMOS binary divider's reset pin #11 is kept low. A saturated NPN transistor's collector emitter's junction's current sinking abilities are what is used to keep the CMOS binary divider's pin 11 low.

This ON or saturated sinking ability of that NPN transistor's collector emitter junction is only kept in its saturated state as long as that transistor's base emitter junction is being kept on using the resistive divider's scaled down part of the 0.2 Hz to 2.0 Hz voltage output from the ULF Section's third stage. Thus, whenever this NPN transistor is not keeping the CMOS binary divider's reset pin #11 low, it is probably because there has not been enough, or at times may be not even any, of the 0.2 Hz to 2.0 Hz third stage's output voltage available to do this. And whenever the CMOS binary divider stops running the first or primary level of squelching gets actuated. This action in turn like the absence of either a 0.718 Hz filtered signal's minimum level or the lack of either the 0.718 Hz or a 11,780 Hz component within the fifth stage, also shuts down the production of any of the binary divider's 184 Hz and/or the 368 Hz square wave voltages which are used to produce any or all of this fifth stage's two different tone encoded outputs.

However, even when there isn't any, or at least not enough, of a ULF Transmitter's 0.718 Hz part of its combined-signal present within the 0.2 Hz to 2.0 Hz bandwidth of the ULF Section's third stage to prevent the actuation of this stage's primary, or first level, of squelching, this primary squelching action doesn't always get actuated. This can happen during any of the surrounding environment's more extreme random noise bursts when there may be enough of the other, or the non 0.718 Hz output voltages, being induced into the receiver's antenna and then being amplified within the whole 0.2 Hz to 2.0 Hz pass band of the ULF Section's first three stages to by themselves keep the binary divider's controlling NPN transistor locked up or on. Thus, if there wasn't the secondary type of a 0.718 Hz and 11,780 Hz interlocked signal's squelching as well as the primary type of a 0.2 to 2.0 passband's squelching both being used within the ULF Section's fifth stage, there might be more than just the occasional random audible event being outputted from this ULF Receiver in the form of a strange or foreign tone or tones and/or an associated but rare invalid instantaneous signal strength reading or readings.

At what is the 2.0 times gain output of this fifth stage only the 184 Hz and the 368 Hz tone bursts that have been made from the fourth stage's two original positive and negative 0.718 Hz half cycle phases experience what has now become the fifth stage's two converted tone's forward gain figure of somewhere between 4,000,000 to 40,000,000 or, (+66 dB to +76 dB). Also at this fifth stage's dual tone's 2.0 times gain output what had been the fourth stage's 60 Hz or 50 Hz total attenuation figure of approximately (−112 dB to −125 dB) remains the same.

This sixth Audio Output stage is the sixth block 94 shown within the ULF Section of the Receiver's basic block and/or logic diagram. In the first of the two internal low noise operational amplifiers used within the input portion of this sixth stage, what was originally the positive and negative 0.718 Hz half cycle based 184 Hz and 368 Hz tone bursts that are now still both separate and are now both positive going get combined within a resistive bridge and kept calibrated to each other because of this first op-amp's unity gain figure. Then this now combined single audible signal is outputted from this first low noise operational amplifier into the capacitive coupled input of the second low noise operational amplifier which has a forward gain of 2.0 or, (+3.0 dB).

And because capacitive coupling is being used to interconnect the first and second low noise operational amplifiers of this sixth stage, the output from the second operational amplifier becomes converted into a fully symmetrical AC signal, as opposed to its original input status which had been as two positive going half cycle tone waveforms.

The final complimentary two power transistor totem pole part of this sixth stage with its constant current bias, and its emitter follower output, converts every 184 Hz and/or 368 Hz tone burst put into it from an ac-voltage into its equivalent much higher 4.0 ohm or 8.0 ohm loads ac current with only a very slight decrease in the overall voltage gain, (approximately from 1.0 to 0.8). This sixth stage's near unity voltage gain's current output is used to provide all of the ULF Receiver's sounds via a set of earphone speakers, plus all the ULF Receiver's visual signal strength measurements via an analog meter's moving coil's reading.

The ULF Receiver's same analog meter's moving coil's signal strength reading can also through the use of a slide switch's other variable selection be made to provide a second visual display that shows the degree of charge remaining on the receiver's center tapped composite 12.6 V-dc battery supply. This battery supply has been made up by or from two interconnected 6.3 V-dc batteries. At the output of this sixth stage, with its overall internal voltage gain of (2.0*0.9*(8.0 ohms/9.0 ohms))=1.6 or, (+2.0 dB), only the fifth stage's output's 184 Hz and 368 Hz proportionally-accurate tone bursts benefit from what is now the entire ULF Receiver's end product's overall forward-gain-figure of somewhere between 6,400,000 to 64,000,000 or, (+68 dB to +78 dB).

The five different blocks 88 to 92 shown under or within the 11,780 Hz-Section 87 of the Receiver's basic block and/or logic diagram when taken together function as a highly tuned single frequency type of amplifier. The Receiver's 11,780 Hz-Section is in most ways a repeat of the Receiver's ULF Section's first four stages. Except this 11,780 Hz Section's version operates at a frequency of 11,780 Hz, and uses a time delayed closed loop automatic gain control feature as opposed to the manual gain control feature that is used within the $2^{nd}$ stage of the ULF Section. On the other hand this 11,780 Hz Section shares the same antenna coil, printed circuit card, case, battery supply, and on/off switch which are also being used or shared by the ULF Section of the Receiver. This Receiver's 11,780 Hz Section is also similar to some of the design ideas used for a 512 Hz type Receiver described in the U.S. Pat. No. 5,428,295 issued 27 Jun. 1995 to the present inventor.

Essentially the output from the 11,780 Hz Section is used to ensure that any of the continuous audible and/or visual outputs that are being produced by the ULF Receiver could only have come from an ULF Transmitter. This is because only a ULF Transmitter's combined signal has a secondary 11,780 Hz signal superimposed on its 0.718 Hz primary signal. Almost all noise signals that may have come from any random source which happen to get through the Receiver's ULF Section's first three stage's initial pass band of 0.2 Hz to 2.0 Hz and then even get through the Receiver's fourth stage's precise 0.718 Hz filter because they also have a 0.718 Hz random component associated with themselves will almost next to never also have a 11,780 Hz random component associated with themselves as well. Thus, because of this dual frequency requirement, most, if not all, of the random noise bursts which have been magnetically induced into the receiver's antenna coil will never make it through the receiver to its output.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A method of detecting high resistance ground faults of a resistance of greater than 250 K-ohms in an underground electric power cable including a central conductor with a dielectric material surrounding the central conductor and a ground return conductor surrounding the dielectric material, the method comprising:

transmitting into a length of the said cable a signal that is connected across the central conductor and the ground return conductor, said signal comprising a primary oscillating waveform at a predetermined frequency and of a predetermined peak to peak voltage;

tracing the length of the said cable with a receiver arranged to detect an electromagnetic field emitted by the said cable in response to the said signal;

selecting the peak to peak voltage and the predetermined frequency to produce in the said high resistance ground faults fault currents from the central conductor to the ground return conductor through the said faults, said fault currents being of sufficient magnitude to generate detectable changes in the magnetic fields around the areas of the said faults;

wherein the said primary oscillating waveform has a frequency between 0.200 Hz and 2.0 Hz.

wherein the said signal includes a second frequency component superimposed on the said primary oscillating wave form to provide an unmistakable marking and/or identification frequency detected by the receiver.

2. The method according to claim 1, wherein the frequency of the primary oscillating waveform is 0.718 Hz.

3. The method according to claim 1, wherein the voltage of the primary oscillating waveform is between 355 V-rms to 3,550 V-rms.

4. The method according to claim 2, wherein the said second frequency component superimposed on the primary oscillating wave form is at 11,789 Hz.

5. The method according to claim 1 wherein the second frequency component is selected such that the electromagnetic field emitted by the cable in response to the signal and received by the receiver is converted within the receiver into an audible tone of a predetermined unique frequency.

6. The method according to claim 1, wherein the oscillating waveform is a square wave signal.

7. The method according to claim 1, wherein the cable is connected to a high-Q series resonant circuit.

8. The method according to claim 5, wherein the receiver uses a four analog switch circuit and a binary divider to convert the electromagnetic field emitted by the cable in response to the signal and received by the receiver into two different and distinctive per half cycle audible tones.

9. The method according to claim 1 wherein the oscillating waveform is created by a transformer providing two direct current supplies at opposite polarity and providing a switching system for connection of the supplies to an output.

10. The method according to claim 9 wherein the switching system is mechanical.

11. The method according to claim 9 wherein the switching system includes a rotary disk with brushes and conductive traces.

12. The method according to claim 11 wherein the conductive traces includes non-connect spaces.

13. The method according to claim 1, wherein there is provided a remote end connection circuit that is connected across the central conductor and the ground return conductor at a remote end of the underground cable, for changing a reactance at the remote end of the underground cable.

14. The method according to claim 13, wherein the remote end connection circuit is used for finding higher resistance ground faults by connecting a resistance across the central conductor and ground return conductor at the remote end, to raise the total amount of resistive current flowing in the cable.

15. The method according to claim 13, wherein the remote end connection circuit is used to search the entire length of a faulted cable by adding more capacitance across the central conductor and the ground return conductor.

* * * * *